United States Patent
Lu et al.

(10) Patent No.: US 12,230,216 B2
(45) Date of Patent: Feb. 18, 2025

(54) SCAN CIRCUIT, DISPLAY SUBSTRATE, AND DISPLAY APPARATUS

(71) Applicant: BOE Technology Group Co., Ltd., Beijing (CN)

(72) Inventors: Jiangnan Lu, Beijing (CN); Zhenzhen Shan, Beijing (CN); Jianchao Zhu, Beijing (CN); Guangliang Shang, Beijing (CN); Xing Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/245,534

(22) PCT Filed: May 31, 2022

(86) PCT No.: PCT/CN2022/096221
§ 371 (c)(1),
(2) Date: Mar. 15, 2023

(87) PCT Pub. No.: WO2023/230835
PCT Pub. Date: Dec. 7, 2023

(65) Prior Publication Data
US 2024/0290275 A1     Aug. 29, 2024

(51) Int. Cl.
*G09G 3/32* (2016.01)
*G09G 3/3266* (2016.01)

(52) U.S. Cl.
CPC ....... *G09G 3/3266* (2013.01); *G09G 2310/08* (2013.01)

(58) Field of Classification Search
CPC .......................... G09G 3/3266; G09G 2310/08
See application file for complete search history.

(56) References Cited

U.S. PATENT DOCUMENTS

2011/0157124 A1   6/2011   Jung et al.
2011/0273417 A1   11/2011  Shin et al.
(Continued)

FOREIGN PATENT DOCUMENTS

CN   102479476 A   5/2012
CN   102779478 A   11/2012
(Continued)

OTHER PUBLICATIONS

International Search Report & Written Opinion mailed Jan. 16, 2023, regarding PCT/CN2022/096221.

*Primary Examiner* — Roy P Rabindranath
(74) *Attorney, Agent, or Firm* — Intellectual Valley Law, P.C.

(57) ABSTRACT

A scan circuit having a plurality of stages is provided. A respective stage includes a respective scan unit configured to provide a control signal to at least a row of subpixels. The respective scan unit includes an input subcircuit configured to receive a start signal or an output signal from a previous scan unit, a first processing subcircuit, a second processing subcircuit, and an output subcircuit. The output subcircuit includes a first output transistor. The input subcircuit includes a first input transistor and a second input transistor sequentially coupled between an input terminal and a first node. The first node is coupled to a gate electrode of the first output transistor. The first processing subcircuit includes a first switch transistor and a second switch transistor coupled between the first node and a first reference terminal. The first reference terminal is configured to receive a first reference signal.

18 Claims, 23 Drawing Sheets

(56) References Cited

U.S. PATENT DOCUMENTS

| | | | |
|---|---|---|---|
| 2012/0300894 A1 | 11/2012 | Wu et al. | |
| 2014/0093028 A1 | 4/2014 | Wu | |
| 2015/0070616 A1 | 3/2015 | Ogasawara et al. | |
| 2015/0293546 A1 | 10/2015 | Tanaka et al. | |
| 2017/0186362 A1* | 6/2017 | Shim | G09G 3/3266 |
| 2020/0342808 A1 | 10/2020 | Han et al. | |
| 2021/0142709 A1 | 5/2021 | Liu et al. | |
| 2021/0358381 A1 | 11/2021 | Wang et al. | |
| 2022/0301497 A1* | 9/2022 | Zhang | G09G 3/3266 |

FOREIGN PATENT DOCUMENTS

| | | |
|---|---|---|
| CN | 103065584 A | 4/2013 |
| CN | 102117659 B | 12/2013 |
| CN | 103871348 A | 6/2014 |
| CN | 102237031 B | 7/2014 |
| CN | 104221072 A | 12/2014 |
| CN | 104464645 A | 3/2015 |
| CN | 104756177 A | 7/2015 |
| CN | 107845403 A | 3/2018 |
| CN | 109584799 A | 4/2019 |
| CN | 109637421 A | 4/2019 |
| CN | 113113071 A | 7/2021 |
| JP | 2010164754 A | 7/2010 |
| JP | 2016118663 A | 6/2016 |

\* cited by examiner ns application is a national stage application under 35 U.S.C. § 371 of International Application No. PCT/CN2022/096221, filed May 31, 2022, the contents of which are incorporated by reference in the entirety.

SCAN CIRCUIT, DISPLAY SUBSTRATE, AND DISPLAY APPARATUS

CROSS-REFERENCE TO RELATED APPLICATION

This application is a national stage application under 35 U.S.C. § 371 of International Application No. PCT/CN2022/096221, filed May 31, 2022, the contents of which are incorporated by reference in the entirety.

TECHNICAL FIELD

The present invention relates to display technology, more particularly, to a scan circuit, a display substrate, and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a scan circuit, comprising a plurality of stages, wherein a respective stage of the scan circuit comprises a respective scan unit configured to provide a control signal to at least a row of subpixels; wherein the respective scan unit comprises an input subcircuit configured to receive from an input terminal a start signal or an output signal from a previous scan unit of a previous stage, a first processing subcircuit, a second processing subcircuit, and an output subcircuit configured to output an output signal from an output terminal; wherein the output subcircuit comprises a first output transistor; wherein the input subcircuit comprises a first input transistor and a second input transistor sequentially coupled between an input terminal and a first node; and the first node is coupled to a gate electrode of the first output transistor; wherein the first processing subcircuit comprises a first switch transistor and a second switch transistor coupled between the first node and a first reference terminal; and the first reference terminal is configured to receive a first reference signal.

Optionally, gate electrodes of the first input transistor and the second input transistor are coupled to a first terminal, and are configured to receive a first clock signal from the first terminal from the first terminal; and a source electrode of the first output transistor is coupled to a second terminal, and is configured to receive a second clock signal from the second terminal.

Optionally, the first processing subcircuit further comprises a first control transistor coupled between a second node and the first reference terminal; a gate electrode of the first control transistor is coupled to the input terminal, and is configured to receive the start signal or the output signal from the previous scan unit of the previous stage; a source electrode of the first control transistor is coupled to the first reference terminal, and is configured to receive the first reference signal; and a drain electrode of the first control transistor is coupled to the second node, which is coupled to gate electrodes of the first switch transistor and the second switch transistor.

Optionally, the second processing subcircuit comprises a second control transistor coupled between a second node and a second reference terminal; the second reference terminal is configured to receive a second reference signal; and a gate electrode of the second control transistor is coupled to a third terminal, and is configured to receive a third clock signal from the third terminal.

Optionally, the first processing subcircuit further comprises a third control transistor coupled between a third node and a second reference terminal; a gate electrode of the third control transistor is coupled to the first node; a source electrode of the third control transistor is coupled to the second reference terminal, and is configured to receive a second reference signal from the second reference terminal; and a drain electrode of the third control transistor is coupled to a drain electrode of the first switch transistor and a source electrode of the second switch transistor.

Optionally, the input subcircuit further comprises a fourth control transistor coupled between a fourth node and a second terminal; the second terminal is configured to receive a second clock signal; the fourth node is coupled to a drain electrode of the first input transistor and a source electrode of the second input transistor; and a gate electrode of the fourth control transistor is coupled to the output terminal, and is configured to receive the output signal from the output terminal.

Optionally, the output subcircuit further comprises a second output transistor coupled between the first reference terminal and the output terminal; and a gate electrode of the second output transistor is coupled to gate electrodes of the first switch transistor and the second switch transistor.

In another aspect, the present disclosure provides a display substrate, comprising the above scan circuit, wherein a first output transistor and a second output transistor of the output subcircuit are arranged in a first region; input transistors, switch transistors, and control transistors of the respective scan unit are arranged in a second region; capacitors of the respective scan unit are arranged in a third region; and the second region, the first region, and the third region are sequentially arranged.

Optionally, the display substrate further comprises one or more clock signal lines arranged in a fourth region; wherein the fourth region, the second region, the first region, and the third region are sequentially arranged.

Optionally, in the second region, the first input transistor and the second input transistor are on a side of the first switch transistor and the second switch transistor closer to one or more clock signal lines; and the first switch transistor and the second switch transistor are on a side of the first input transistor and the second input transistor closer to the first output transistor and the second output transistor.

Optionally, the first input transistor, the second input transistor, the first switch transistor, and the second switch transistor are clustered in a central region; the respective scan unit further comprises a first control transistor, a second control transistor, a third control transistor, and a fourth control transistor; the first control transistor and the second control transistor are on a first side of the central region; the third control transistor and the fourth control transistor are on a second side of the central region; and the first side and the second side are two opposite sides with respect to the central region along an extension direction of one or more clock signal lines.

Optionally, the second control transistor is on a side of the first control transistor closer to the one or more clock signal lines, and the first control transistor is on a side of the second control transistor closer to the first output transistor and the second output transistor.

Optionally, the display substrate comprises a semiconductor material layer; wherein the semiconductor material layer comprises active layers of one or more transistors of the respective scan unit; an active layer of the first input transistor and an active layer of the second input transistor are parts of a first unitary structure in the semiconductor material layer; and at least a portion of the first unitary structure has a L shape or an I shape.

Optionally, the first unitary structure further comprises an active layer of a fourth control transistor.

Optionally, the display substrate comprises a semiconductor material layer; wherein the semiconductor material layer comprises active layers of one or more transistors of the respective scan unit; an active layer of the first switch transistor and an active layer of the second switch transistor are parts of a second unitary structure in the semiconductor material layer; and at least a portion of the second unitary structure has a L shape or an I shape.

Optionally, the second unitary structure further includes an active layer of a first control transistor.

Optionally, the first output transistor has a first occupied area; the second output transistor has a second occupied area; the first occupied area is greater than the second occupied area; and a ratio of the first occupied area to the second occupied area is greater than or equal to 1.5:1.

Optionally, an active layer of the first output transistor has a first channel width; an active layer of the second output transistor has a second channel width; the first channel width is greater than the second channel width; and a ratio of the first channel width to the second channel width is greater than or equal to 1.5:1.

Optionally, the display substrate further comprises a first reference signal line and a second reference signal line; wherein the first reference signal line is in the third region; the second reference signal line is in the fourth region; and transistors of the respective scan unit are between the first reference signal line and the second reference signal line.

In another aspect, the present disclosure provides a display apparatus, comprising the display substrate described herein, and one or more integrated circuits connected to the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a scan circuit, a display substrate, and a display apparatus that substantially obviate one or more of the problems due to limitations and disadvantages of the related art. In one aspect, the present disclosure provides a scan circuit comprising a plurality of stages. In some embodiments, a respective stage of the scan circuit includes a respective scan unit configured to provide a control signal to at least a row of subpixels. Optionally, the respective scan unit includes an input subcircuit configured to receive from an input terminal a start signal or an output signal from a previous scan unit of a previous stage, a first processing subcircuit, a second processing subcircuit, and an output subcircuit configured to output an output signal from an output terminal. Optionally, the output subcircuit comprises a first output transistor. Optionally, the input subcircuit comprises a first input transistor and a second input transistor sequentially coupled between an input terminal and a first node; and the first node is coupled to the gate electrode of the first output transistor. Optionally, the first processing subcircuit comprises a first switch transistor and a second switch transistor coupled between the first node and a first reference terminal; and the first reference terminal is configured to receive a first reference signal.

Figure 1:
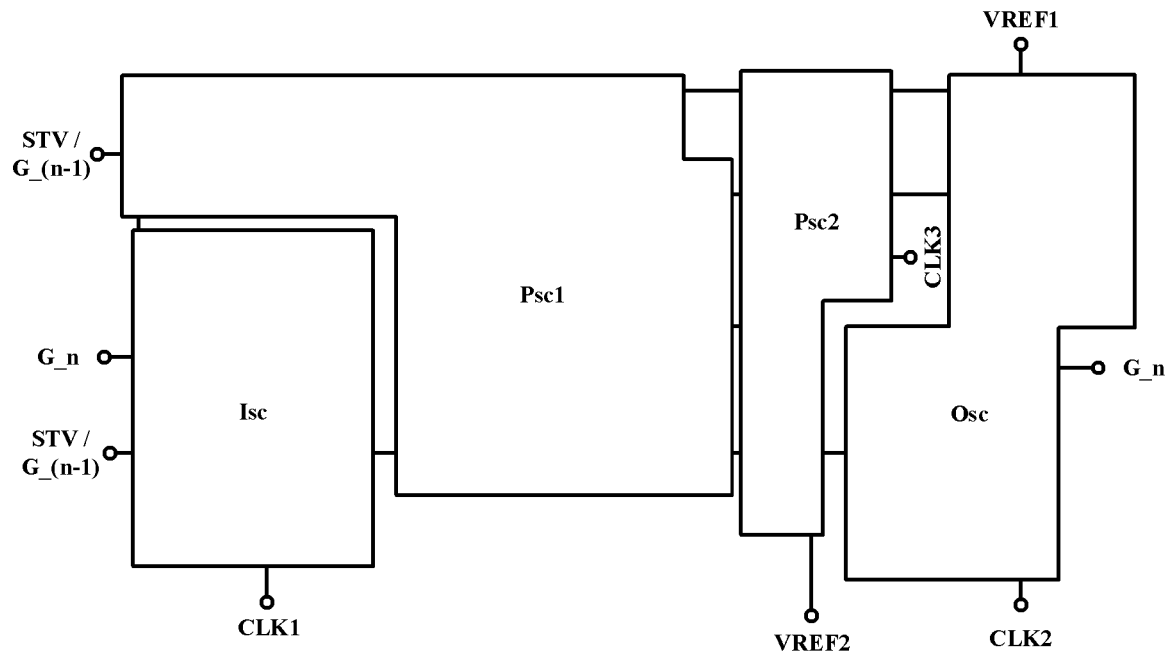
FIG. 1 is a schematic diagram illustrating a respective scan unit in a scan circuit in some embodiments according to the present disclosure.

FIG. 1 is a schematic diagram illustrating a respective scan unit in a scan circuit in some embodiments according to the present disclosure. Referring to FIG. 1, the respective scan unit in some embodiments includes an input subcircuit Isc, a first processing subcircuit Psc1, a second processing subcircuit Psc2, and an output subcircuit Osc. The input subcircuit Isc is configured to receive a start signal STV or an output signal G_(n−1) from a previous scan unit of a previous stage. Optionally, the input subcircuit Isc is further configured to receive a first clock signal CLK1. Optionally, the input subcircuit Isc is further configured to receive an output signal G_n. The Input subcircuit Isc is connected to the first processing subcircuit Psc1.

In some embodiments, the first processing subcircuit Psc1 is configured to receive a start signal STV or an output signal G_(n−1) from a previous scan unit of a previous stage. The first processing subcircuit Psc1 is connected to the input subcircuit Isc, and to the second processing subcircuit Psc2.

In some embodiments, the second processing subcircuit Psc2 is configured to receive a second reference signal VREF2 (e.g., a constant low voltage signal). The second processing subcircuit Psc2 is connected to the first processing subcircuit Psc1, and to the output subcircuit Osc.

In some embodiments, the output subcircuit Osc is configured to receive a first reference signal VREF1 (e.g., a constant high voltage signal). The output subcircuit Osc is connected to the second processing subcircuit Psc2.

Figure 2:
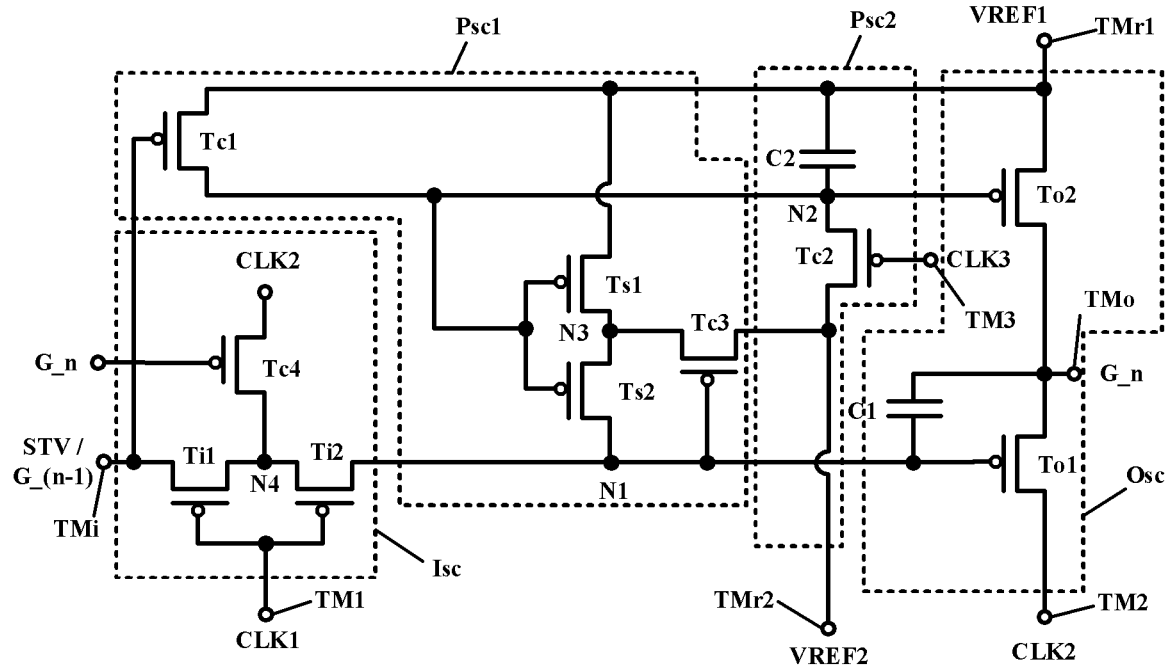
FIG. 2 is a circuit diagram of a respective scan unit in a scan circuit in some embodiments according to the present disclosure.

FIG. 2 is a circuit diagram of a respective scan unit in a scan circuit in some embodiments according to the present disclosure. FIG. 2 illustrates a respective scan unit in which the transistors are p-type transistors. Various implementations of the scan circuit may be practiced. In one example, the transistors of the scan circuit may be p-type transistors, as illustrated in FIG. 2. In another example, the transistors of the scan circuit may be n-type transistors. In another example, the transistors of the scan circuit may include one or more p-type transistors and one or more n-type transistors.

Referring to FIG. 2, in some embodiments, the input subcircuit Isc includes a first input transistor Ti1, and second input transistor Ti2, and a fourth control transistor Tc4. The first input transistor Ti1 is coupled between an input terminal TMi and a fourth node N4. The second input transistor Ti2 is coupled between the fourth node N4 and a first node N1. The fourth control transistor Tc4 is coupled between the fourth node N4 and a second terminal TM2. The first node N1 is coupled to the input subcircuit Isc, the first processing subcircuit Psc1, and the output subcircuit Osc.

A gate electrode of the first input transistor Ti1 is coupled to the first terminal TM1, and is configured to receive the first clock signal CLK1 from the first terminal TM1. A source electrode of the first input transistor Ti1 is coupled to the input terminal TMi, and is configured to receive a start signal STV or an output signal G_(n−1) from a previous scan unit of a previous stage. A drain electrode of the first input transistor Ti1 is coupled to the fourth node N4.

A gate electrode of the second input transistor Ti2 is coupled to the first terminal TM1, and is configured to receive the first clock signal CLK1 from the first terminal TM1. A source electrode of the second input transistor Ti2 is coupled to the fourth node N4. A drain electrode of the second input transistor Ti2 is coupled to the first node N1.

A gate electrode of the fourth control transistor Tc4 is coupled to an output terminal TMo, and is configured to receive an output signal G_n from a present scan unit of a present stage. A source electrode of the fourth control transistor Tc4 is coupled to the second terminal TM2, and is configured to receive a second clock signal CLK2. A drain electrode of the fourth control transistor Tc4 is coupled to the fourth node N4.

In some embodiments, the first processing subcircuit Psc1 includes a first control transistor Tc1, a first switch transistor Ts1, a second switch transistor Ts2, and a third control transistor Tc3. The first control transistor Tc1 is coupled between a second node N2 and a first reference terminal TMr1. The first switch transistor Ts1 is coupled between the first reference terminal TMr1 and a third node N3. The second switch transistor Ts2 is coupled between the third node N3 and the first node N1. The third control transistor Tc3 is coupled between the third node N3 and a second reference terminal TMr2.

A gate electrode of the first control transistor Tc1 is coupled to the input terminal TMi, and is configured to receive a start signal STV or an output signal G_(n−1) from a previous scan unit of a previous stage. A source electrode of the first control transistor Tc1 is coupled to the first reference terminal TMr1, and is configured to receive the first reference signal VREF1. A drain electrode of the first control transistor Tc1 is coupled to the second node, and coupled to gate electrodes of the first switch transistor Ts1 and the second switch transistor Ts2.

A gate electrode of the first switch transistor Ts1 is coupled to the second node N2. A source electrode of the first switch transistor Ts1 is coupled to the first reference terminal TMr1, and is configured to receive the first reference signal VREF1. A drain electrode of the first switch transistor Ts1 is coupled to a third node N3.

A gate electrode of the second switch transistor Ts2 is coupled to the second node N2. A source electrode of the second switch transistor Ts2 is coupled to the third node N3. A drain electrode of the second switch transistor Ts2 is coupled to the first node N1.

A gate electrode of the third control transistor Tc3 is coupled to the first node N1. A source electrode of the third control transistor Tc3 is coupled to a second reference terminal TMr2, and is configured to receive a second reference signal VREF2. A drain electrode of the third control transistor Tc3 is coupled to the third node N3.

In some embodiments, the second processing subcircuit Psc2 includes a second capacitor C2 and a second control transistor Tc2. The second capacitor C2 is coupled between the first reference terminal TMr1 and the second node N2. The second control transistor Tc2 is coupled between the second node N2 and the second reference terminal TMr2.

A first capacitor electrode of the second capacitor C2 is coupled to the first reference terminal TMr1, and is configured to receive the first reference signal VREF1. A second capacitor electrode of the second capacitor C2 is coupled to the second node N2.

A gate electrode of the second control transistor Tc2 is coupled to a third terminal TM3, and is configured to receive a third clock signal CLK3. A source electrode of the second control transistor Tc2 is coupled to the second reference terminal TMr2, and is configured to receive a second reference signal VREF2. A drain electrode of the second control transistor Tc2 is coupled to the second node N2.

In some embodiments, the output subcircuit Osc includes a first capacitor C1, a second output transistor To2, and a first output transistor To1. The first capacitor C1 is coupled between an output terminal TMo and the first node N1. The second output transistor To2 is coupled between the first reference terminal TMr1 and the output terminal TMo. The first output transistor To1 is coupled between the output terminal TMo and a second terminal TM2.

A first capacitor electrode of the first capacitor C1 is coupled to the output terminal TMo. A second capacitor electrode of the first capacitor C1 is coupled to the first node N1.

A gate electrode of the second output transistor To2 is coupled to the second node N2. A source electrode of the second output transistor To2 is coupled to the first reference terminal TMr1, and is configured to receive the first reference signal VREF1. A drain electrode of the second output transistor To2 is coupled to the output terminal TMo.

A gate electrode of the first output transistor To1 is coupled to the first node N1. A source electrode of the first output transistor To1 is coupled to a second terminal TM2, and is configured to receive a second clock signal CLK2. A drain electrode of the first output transistor To1 is coupled to the output terminal TMo.

The gate electrode of the first control transistor Tc1 is coupled to the source electrode of the first input transistor Ti1. The drain electrode of the first input transistor Ti1 is coupled to the source electrode of the second input transistor Ti2, and coupled to the drain electrode of the fourth control transistor Tc4. The source electrode of the first control transistor Tc1 is coupled to the first capacitor electrode of the second capacitor C2, and coupled to the source electrode of the second output transistor To2. The drain electrode of the first control transistor Tc1 is coupled to gate electrodes of the first switch transistor Ts1 and the second switch transistor Ts2.

The drain electrode of the first switch transistor Ts1 is coupled to the source electrode of the second switch transistor Ts2, and is coupled to the drain electrode of the third control transistor Tc3.

The gate electrode of the first output transistor To1 is coupled to the second capacitor electrode of the first capacitor C1, coupled to the gate electrode of the third control transistor Tc3, and coupled to drain electrodes of the second switch transistor Ts2 and the second input transistor Ti2.

The source electrode of the second control transistor Tc2 is coupled to the source electrode of the third control transistor Tc3.

The drain electrode of the second output transistor To2 is coupled to the drain electrode of the first output transistor To1, and coupled to the first capacitor electrode of the first capacitor C1.

Figure 3:
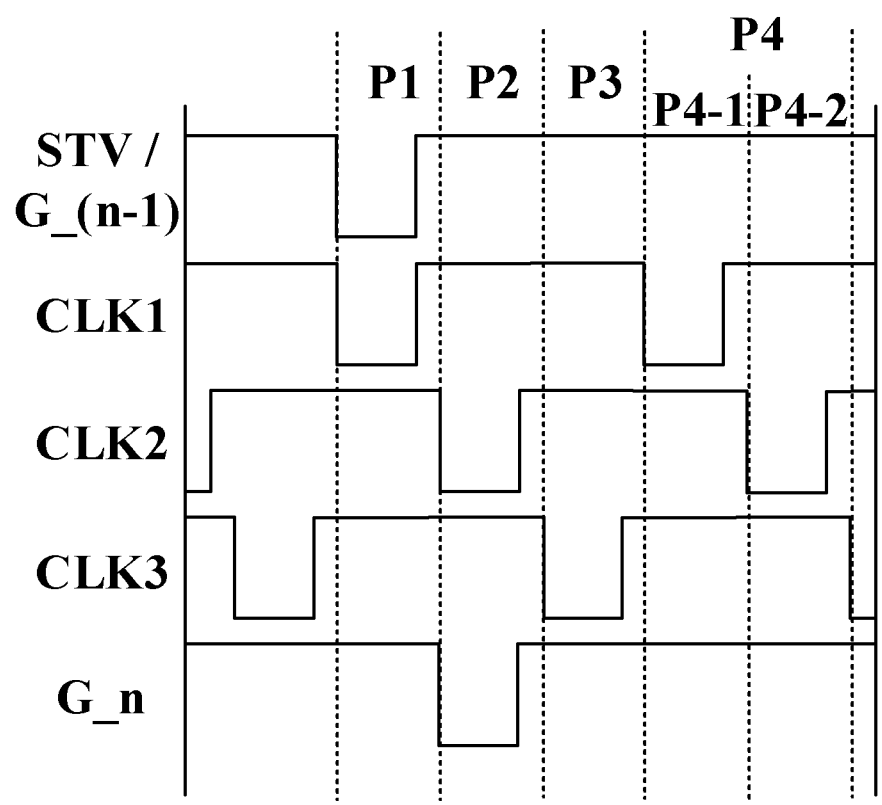
FIG. 3 is a timing diagram of operating a respective scan unit in a scan circuit in some embodiments according to the present disclosure.

FIG. 3 is a timing diagram of operating a respective scan unit in a scan circuit in some embodiments according to the present disclosure. Referring to FIG. 3, in some embodiments, the respective scan unit in a frame of image may be operated in a first period P1 to a fourth period P4.

Referring to FIG. 1, FIG. 2, and FIG. 3, in a first period P1, an effective voltage of a start signal STV or an output signal G_(n−1) from a previous scan unit of a previous stage is provided to the input terminal TMi; an effective voltage of a first clock signal CLK1 is provided to the first terminal TM1; an ineffective voltage of a second clock signal CLK2 is provided to the second terminal TM2; and an ineffective voltage of a third clock signal CLK3 is provided to the third terminal TM3. As used herein, an effective voltage refers to a low voltage in the context of p-type transistors and to a high voltage in the context of n-type transistors; and an ineffective voltage refers to a high voltage in the context of p-type transistors and to a low voltage in the context of n-type transistors.

In the first period P1, the first input transistor Ti1 and the second input transistor Ti2 are turned on by the effective voltage of the first clock signal CLK1; the first control transistor Tc1 is turned on by the effective voltage of the start signal STV or the output signal G_(n−1) from a previous scan unit of a previous stage from the input terminal TMi. When the first input transistor Ti1 and the second input transistor Ti2 are turned on, the first node N1 and the fourth node N4 are charged to an effective voltage level (e.g., a low voltage level in the context of p-type transistors) by the effective voltage of the start signal STV or the output signal G_(n−1) from a previous scan unit of a previous stage. The first output transistor To1 is turned on by the effective voltage of the start signal STV or the output signal G_(n−1) from a previous scan unit of a previous stage, allowing the second clock signal CLK2 to be transmitted to the output terminal TMo. In the first period P1, the second clock signal CLK2 is an ineffective voltage signal (e.g., a high voltage signal in the context of p-type transistors). Accordingly, the output signal G_n is an ineffective control signal.

In the first period P1, the first control transistor Tc1 is turned on, allowing the first reference signal VREF1 from a first reference terminal TMr1 to be transmitted to the second node N2. The first reference signal VREF1 is an ineffective voltage signal (e.g., a high voltage signal in the context of p-type transistors). Accordingly, the second output transistor To2, the first switch transistor Ts1, and the second switch transistor Ts2 are turned off.

In the first period P1, the second control transistor Tc2 is turned off by the ineffective voltage of the third clock signal CLK3. The fourth control transistor Tc4 is turned off by the ineffective voltage of the output signal G_n.

Referring to FIG. 1, FIG. 2, and FIG. 3, in a second period P2, an ineffective voltage of a start signal STV or an output signal G_(n−1) from a previous scan unit of a previous stage is provided to the input terminal TMi; an ineffective voltage of a first clock signal CLK1 is provided to the first terminal TM1; an effective voltage of a second clock signal CLK2 is provided to the second terminal TM2; and an ineffective voltage of a third clock signal CLK3 is provided to the third terminal TM3.

In the second period P2, the first control transistor Tc1 is turned off by the ineffective voltage of a start signal STV or an output signal G_(n−1) from a previous scan unit of a previous stage. The first clock signal CLK1 is an ineffective voltage signal (e.g., a high voltage signal in the context of p-type transistors). The first input transistor Ti1 and the second input transistor Ti2 are turned off. The second control transistor Tc2 is turned off by the ineffective voltage of the third clock signal CLK3. The voltage level at the second node N2 remains at the ineffective voltage level (e.g., a high voltage level in the context of p-type transistors). The first switch transistor Ts1 and the second switch transistor Ts2 are turned off by the ineffective voltage at the second node N2.

In the second period P2, the second input transistor Ti2 and the second switch transistor Ts2 are turned off. The voltage level at the first node N1 remains at the effective voltage level (e.g., a low voltage level in the context of p-type transistors). The first output transistor To1 remains turned on by the effective voltage at the first node N1, allowing the second clock signal CLK2 to be transmitted to the output terminal TMo. In the second period P2, the second clock signal CLK2 is an effective voltage signal (e.g., a low voltage signal in the context of p-type transistors). Accordingly, the output signal G_n is an effective control signal.

In the second period P2, the voltage level at the second node N2 remains at the ineffective voltage level, the second output transistor To2 remains turned off.

In the second period P2, the second control transistor Tc2 is turned off by the ineffective voltage of the third clock signal CLK3.

In the second period P2, the fourth control transistor Tc4 is turned on by the effective voltage of the output signal G_n. The fourth node N4 is charged with the effective voltage of the second clock signal CLK2.

Referring to FIG. 1, FIG. 2, and FIG. 3, in a third period P3, an ineffective voltage of a start signal STV or an output signal G_(n−1) from a previous scan unit of a previous stage is provided to the input terminal TMi; an ineffective voltage of a first clock signal CLK1 is provided to the first terminal TM1; an ineffective voltage of a second clock signal CLK2 is provided to the second terminal TM2; and an effective voltage of a third clock signal CLK3 is provided to the third terminal TM3.

In the third period P3, the first control transistor Tc1 is turned off by the ineffective voltage of a start signal STV or an output signal G_(n−1) from a previous scan unit of a previous stage. The first clock signal CLK1 is an ineffective voltage. The first input transistor Ti1 and the second input transistor Ti2 are turned off by the ineffective voltage of the first clock signal CLK1.

In the third period P3, the third clock signal CLK3 is an effective voltage. The second control transistor Tc2 is turned on by the effective voltage of the third clock signal CLK3 provided at the third terminal TM3, allowing the second reference signal VREF2 from a second reference terminal TMr2 to be transmitted to the second node N2. The second reference signal VREF2 is an effective voltage signal (e.g., a low voltage signal in the context of p-type transistors). Accordingly, the second output transistor To2, the first switch transistor Ts1, and the second switch transistor Ts2 are turned on.

In the third period P3, the first switch transistor Ts1 and the second switch transistor Ts2 are turned on by the effective voltage at the second node N2, allowing the first reference signal VREF1 from a first reference terminal TMr1 to be transmitted to the third node N3 and the first node N1. The first output transistor To1 and the third control transistor Tc3 are turned off by the ineffective voltage of the first reference signal VREF1.

In the third period P3, the second output transistor To2 is turned on by the effective voltage at the second node N2, allowing the first reference signal VREF1 from a first reference terminal TMr1 to be transmitted to the output terminal TMo. The first reference signal VREF1 is an ineffective voltage signal (e.g., a high voltage signal in the context of p-type transistors). Accordingly, the output signal G_n is an ineffective control signal.

In the third period P3, the fourth control transistor Tc4 is turned off by the ineffective voltage of the output signal G_n.

Referring to FIG. 1, FIG. 2, and FIG. 3, in a fourth period P4, an ineffective voltage of a start signal STV or an output signal G_(n−1) from a previous scan unit of a previous stage is provided to the input terminal TMi; and an ineffective voltage of a third clock signal CLK3 is provided to the third terminal TM3.

In some embodiments, the fourth period P4 includes a first phase P4-1 and a second phase P4-2. In the first phase P4-1, an effective voltage of a first clock signal CLK1 is provided to the first terminal TM1; an ineffective voltage of a second clock signal CLK2 is provided to the second terminal TM2. In the second phase P4-2, an ineffective voltage of a first clock signal CLK1 is provided to the first terminal TM1; an effective voltage of a second clock signal CLK2 is provided to the second terminal TM2.

In the first phase P4-1, the first input transistor Ti1 and the second input transistor TI2 are turned on by the effective voltage of the first clock signal CLK1, allowing the ineffective voltage of a start signal STV or an output signal G_(n−1) from a previous scan unit of a previous stage to be transmitted to the first node N1 and the fourth node N4.

In the first phase P4-1, the first control transistor Tc1 is turned off by the ineffective voltage of a start signal STV or an output signal G_(n−1) from a previous scan unit of a previous stage. The second control transistor Tc2 is turned off by the ineffective voltage of the third clock signal CLK3 provided to the third terminal TM3. The voltage level at the second node N2 remains at the effective voltage level (e.g., a low voltage level in the context of p-type transistors). The second output transistor To2 is turned on by the effective voltage at the second node N2, allowing the ineffective voltage of the first reference signal VREF1 from a first reference terminal TMr1 to be transmitted to the output terminal TMo. The first reference signal VREF1 is an ineffective voltage signal (e.g., a high voltage signal in the context of p-type transistors). Accordingly, the output signal G_n is an ineffective control signal.

In the first phase P4-1, the first output transistor To1 is turned off by the ineffective voltage at the first node N1.

In the first phase P4-1, the first switch transistor Ts1 and the second switch transistor Ts2 are turned on by the effective voltage at the second node N2, allowing the ineffective voltage of the first reference signal VREF1 from a first reference terminal TMr1 to be transmitted to the first node N1.

In the first phase P4-1, the third control transistor Tc3 is turned off by the ineffective voltage at the first node N1.

In the first phase P4-1, the fourth control transistor Tc4 is turned off by the ineffective voltage of the output signal G_n.

In the second phase P4-2, the first input transistor Ti1 and the second input transistor Ti2 are turned off by the ineffective voltage of the first clock signal CLK1; the first control transistor Tc1 is turned off by the ineffective voltage of a start signal STV or an output signal G_(n−1) from a previous scan unit of a previous stage; and the second control transistor Tc2 is turned off by the ineffective voltage of the third clock signal CLK3 provided to the third terminal TM3. The voltage level at the first node N1 remains an ineffective voltage level (e.g., a high voltage level in the context of p-type transistors), and the voltage level at the second node N2 remains an effective voltage level (e.g., a low voltage level in the context of p-type transistors). The second output transistor To2 is turned on by the effective voltage at the second node N2, allowing the ineffective voltage of the first reference signal VREF1 from a first reference terminal TMr1 to be transmitted to the output terminal TMo. The first reference signal VREF1 is an ineffective voltage signal (e.g., a high voltage signal in the context of p-type transistors). Accordingly, the output signal G_n is an ineffective control signal.

In the second phase P4-2, the first output transistor To1 is turned off by the ineffective voltage at the first node N1.

In the second phase P4-2, the first switch transistor Ts1 and the second switch transistor Ts2 are turned on by the effective voltage at the second node N2, allowing the ineffective voltage of the first reference signal VREF1 from a first reference terminal TMr1 to be transmitted to the first node N1.

In the second phase P4-2, the third control transistor Tc3 is turned off by the ineffective voltage at the first node N1.

In the second phase P4-2, the fourth control transistor Tc4 is turned off by the ineffective voltage of the output signal G_n.

Figure 4:
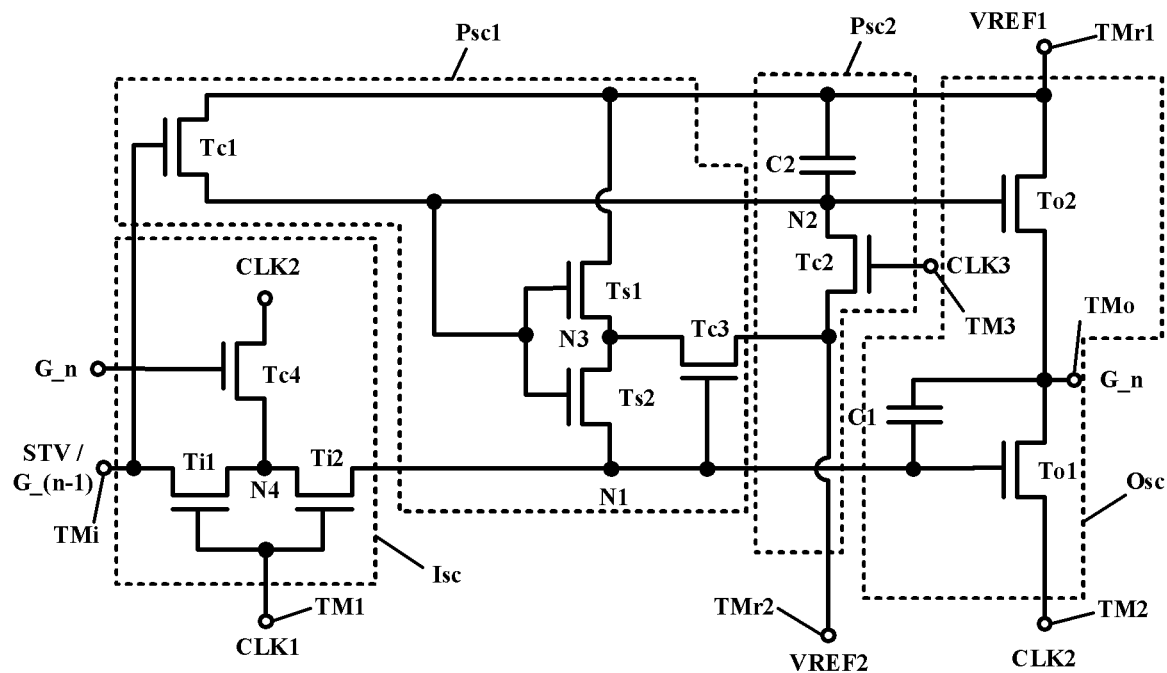
FIG. 4 is a circuit diagram of a respective scan unit in a scan circuit in some embodiments according to the present disclosure.

FIG. 4 is a circuit diagram of a respective scan unit in a scan circuit in some embodiments according to the present disclosure. The respective scan unit depicted in FIG. 4 is otherwise the same as the respective scan unit depicted in FIG. 2 except that the transistors in the respective scan unit depicted in FIG. 4 are all n-type transistors, whereas the transistors in the respective scan unit depicted in FIG. 2 are all p-type transistors. The operation of the respective scan unit depicted in FIG. 4 is otherwise the same as the operation of the respective scan unit depicted in FIG. 2 except that the effective voltages for operating the respective scan unit depicted in FIG. 4 are high voltages, whereas the effective voltages for operating the respective scan unit depicted in FIG. 2 are low voltages. Moreover, the first reference signal for operating the respective scan unit depicted in FIG. 4 is a constant low voltage signal, whereas the first reference signal for operating the respective scan unit depicted in FIG. 2 is a constant high voltage signal; and that the second reference signal VREF2 for operating the respective scan unit depicted in FIG. 4 is a constant high voltage signal, whereas the second reference signal VREF2 for operating the respective scan unit depicted in FIG. 2 is a constant low voltage signal.

Figure 5:
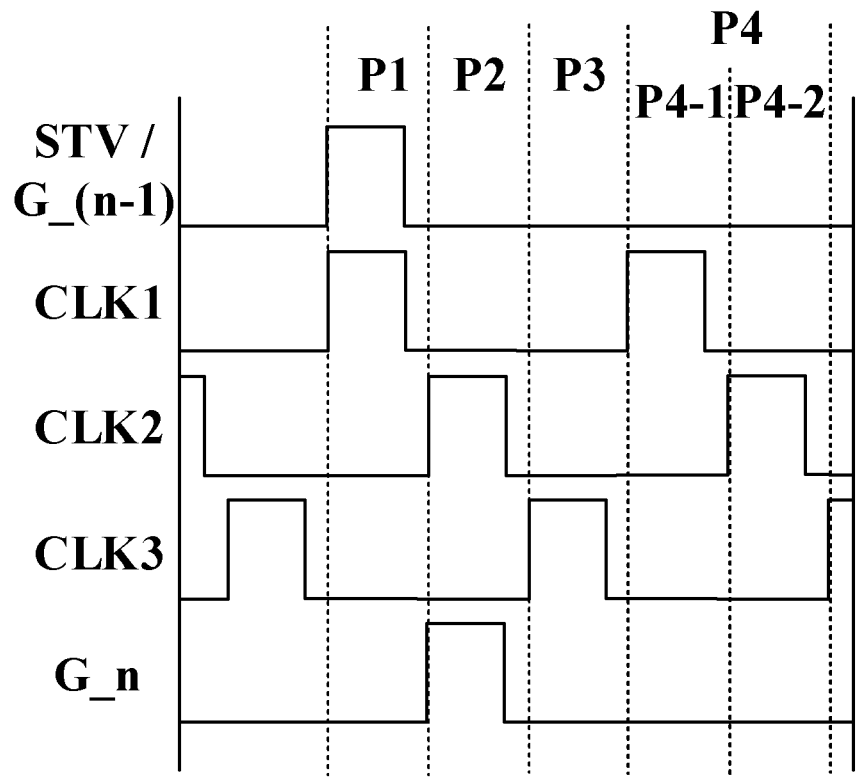
FIG. 5 is a timing diagram of operating a respective scan unit in a scan circuit in some embodiments according to the present disclosure.

FIG. 5 is a timing diagram of operating a respective scan unit in a scan circuit in some embodiments according to the present disclosure. FIG. 5 illustrates the operation of the respective scan unit depicted in FIG. 4 in some embodiments according to the present disclosure. The timing diagram of operating the respective scan unit depicted in FIG. 5 is otherwise the same as the timing diagram of operating the respective scan unit depicted in FIG. 3, except that the effective voltages for operating the respective scan unit depicted in FIG. 5 are high voltages, wherein the effective voltages for operating the respective scan unit depicted in FIG. 3 are low voltages. Moreover, the first reference signal for operating the respective scan unit depicted in FIG. 5 is a constant low voltage signal, whereas the first reference signal for operating the respective scan unit depicted in FIG. 3 is a constant high voltage signal; and that the second reference signal VREF2 for operating the respective scan unit depicted in FIG. 5 is a constant high voltage signal, whereas the second reference signal VREF2 for operating the respective scan unit depicted in FIG. 3 is a constant low voltage signal.

In the present scan circuit, the respective scan unit includes a plurality of input transistors (e.g., the first input transistor Ti1 and the second input transistor Ti2) sequentially coupled between the input terminal TMi and the first node N1. The first node N1 is coupled to the gate electrode of the first output transistor To1. The respective scan unit may further include a plurality of switch transistors (e.g., the first switch transistor Ts1 and the second switch transistor Ts2) coupled between the first node N1 and the first reference terminal TMr1. The first reference terminal TMr1 is configured to receive the first reference signal VREF1 (e.g., a constant high voltage signal in the context of p-type transistors). By having the plurality of input transistors or the plurality of switch transistors, leakage at the N1 node (coupled to the gate electrode of the first output transistor To1) can be prevented or significantly reduced, particularly in the second period P2 during which an effective control signal of G_n is output.

Figure 6:
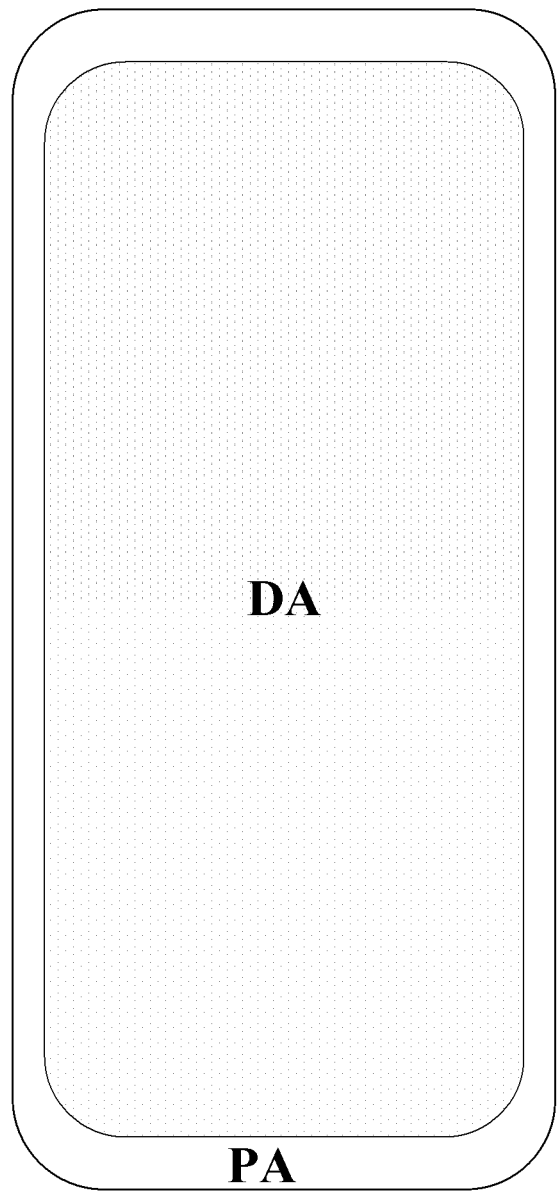
FIG. 6 is a schematic diagram illustrating the structure of a display substrate in some embodiments according to the present disclosure.

In another aspect, the present disclosure further provides a display substrate. FIG. 6 is a schematic diagram illustrating the structure of a display substrate in some embodiments according to the present disclosure. Referring to FIG. 6, the display substrate in some embodiments includes a display region DA and a peripheral region PA. As used herein, the term "display region" refers to an area of a display substrate in a display panel where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. As used herein the term "peripheral region" refers to an area of a display substrate in a display panel where various circuits and wires are provided to transmit signals to the display substrate. To increase the transparency of the display apparatus, non-transparent or opaque components of the array apparatus (e.g., battery, printed circuit board, metal frame), can be disposed in the peripheral region rather than in the display region.

Figure 7:
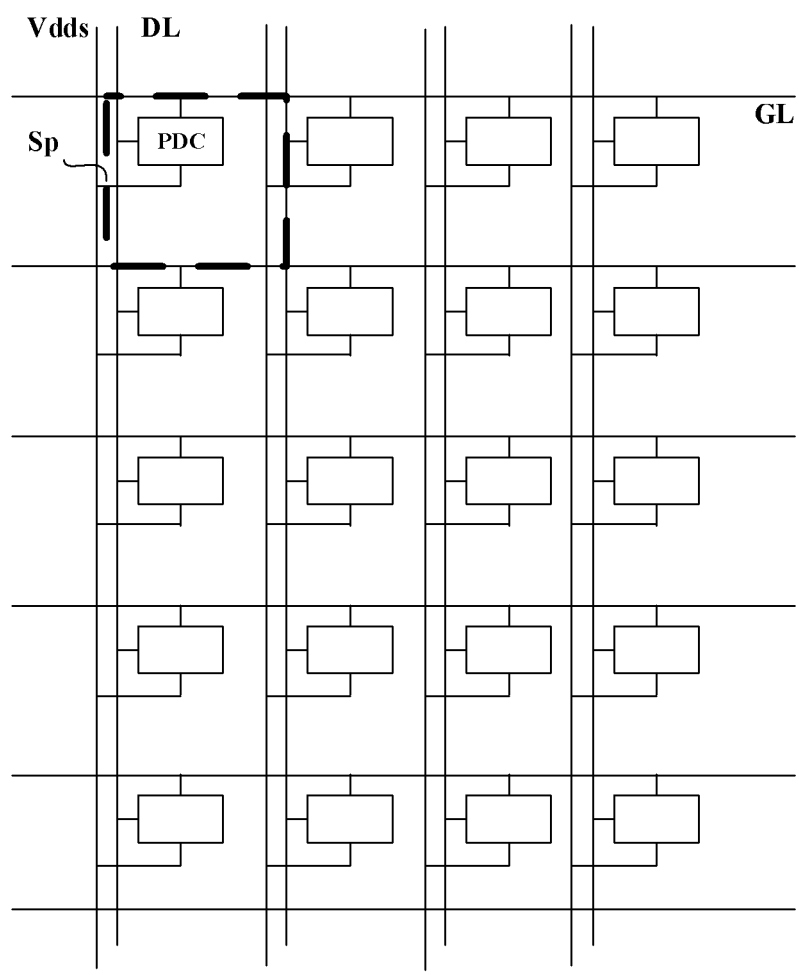
FIG. 7 is a circuit diagram of a display substrate in some embodiments according to the present disclosure.

FIG. 7 is a circuit diagram of a display substrate in some embodiments according to the present disclosure. Referring to FIG. 7, the display substrate includes an array of subpixels. Each subpixel includes an electronic component, e.g., a light emitting element. In some embodiments, the display substrate further includes a plurality of light emitting elements driven by the plurality of pixel driving circuits. In one example, the light emitting element is driven by a respective pixel driving circuit. The display substrate includes a plurality of gate lines GLs, a plurality of data lines DLs, and a plurality of power supply voltage lines Vdds. Light emission in a respective subpixel Sp is driven by a respective pixel driving circuit RPC. In one example, a high voltage signal is input, through a respective one of the plurality of power supply voltage lines Vdds, to the respective pixel driving circuit PDC connected to an anode of the light emitting element; a low voltage signal (by a constant voltage supply line) is input to a cathode of the light emitting element. A voltage difference between the high voltage signal (e.g., the VDD signal) and the low voltage signal (e.g., the VSS signal) is a driving voltage ΔV that drives light emission in the light emitting element.

The display substrate in some embodiments includes a plurality of subpixels. In some embodiments, the plurality of subpixels includes a respective first subpixel, a respective second subpixel, a respective third subpixel, and a respective fourth subpixel. Optionally, a respective pixel of the display substrate includes the respective first subpixel, the respective second subpixel, the respective third subpixel, and the respective fourth subpixel. The plurality of subpixels in the display substrate are arranged in an array. In one example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

Various appropriate pixel driving circuits may be used in the present display substrate. Examples of appropriate driving circuits include 3T1C, 2T1C, 4T1C, 4T2C, 5T2C, 6T1C, 7T1C, 7T2C, 8T1C, and 8T2C. Various appropriate light emitting elements may be used in the present display substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 8:
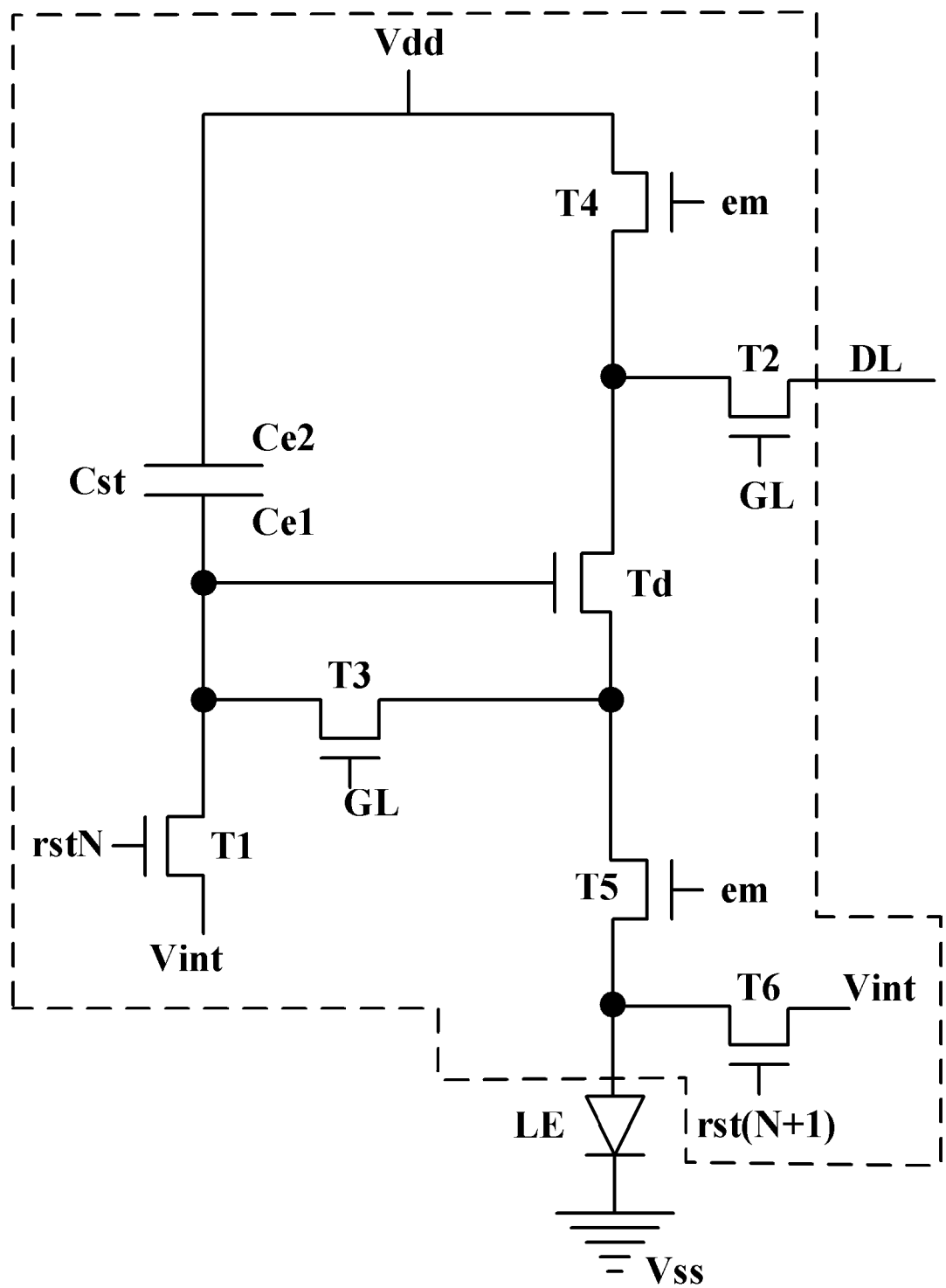
FIG. 8 is a circuit diagram illustrating the structure of a pixel driving circuit in some embodiments according to the present disclosure.

FIG. 8 is a circuit diagram illustrating the structure of a pixel driving circuit in some embodiments according to the present disclosure. Referring to FIG. 8, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage of a plurality of reset control signal lines, a source electrode connected to a respective reset signal line Vint in a present stage of a plurality of first reset signal lines, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a respective reset control signal line rst(N+1) in a next adjacent stage of a plurality of reset control signal lines, a source electrode connected to a respective reset signal line Vint in the present stage of the plurality of second reset signal lines, and a drain electrode connected to the drain electrode of the fifth transistor and the anode of the light emitting element LE. The second capacitor electrode Ce2 is connected to the respective voltage supply line and the source electrode of the fourth transistor T4.

In one example, the scan circuit is a gate scanning signal scan circuit configured to provide light emitting control signals to the plurality of gate lines. In another example, the scan circuit is a light emitting control signal scan circuit configured to provide light emitting control signals to the plurality of light emitting control signal lines. In another example, the scan circuit is a reset control signal scan circuit configured to provide reset control signals to the plurality of reset control signal lines.

The scan circuit in some embodiments is in the peripheral region. The light emitting elements and the pixel driving circuits in some embodiments are in the display region.

Figure 9A:
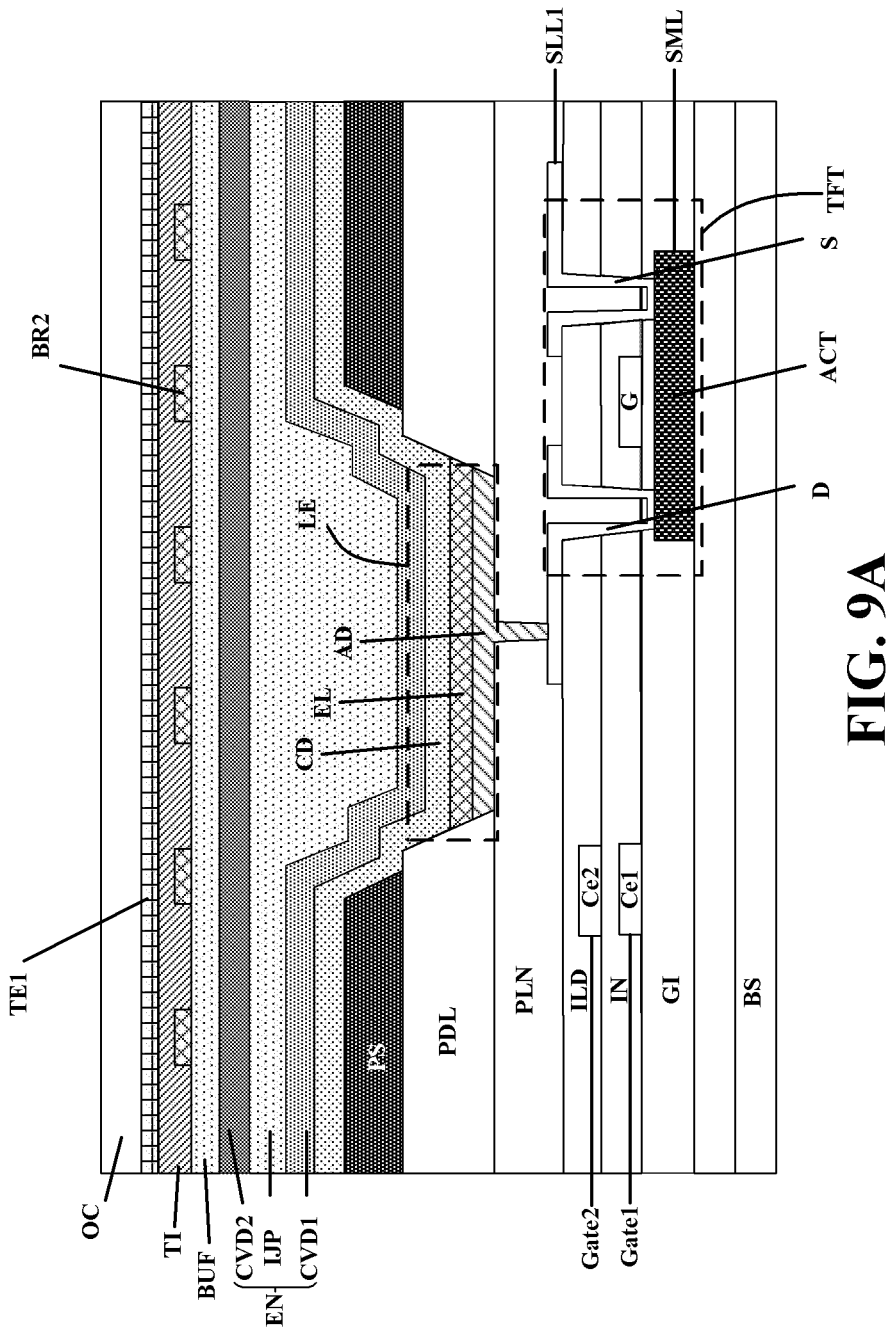
FIG. 9A illustrates a detailed structure in a display region in a display substrate in some embodiments according to the present disclosure.

Various implementations of the present display substrate may be practiced. FIG. 9A illustrates a detailed structure in a display region in a display substrate in some embodiments according to the present disclosure. Referring to FIG. 9A, the display substrate in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a first electrode S and a second electrode D (parts of a first SD metal layer) on a side of the inter-layer dielectric layer ILD away from the gate insulating layer GI; a planarization layer PLN on a side of the first electrode S and the second electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display substrate in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display substrate in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Referring to FIG. 9A, the display substrate includes a semiconductor material layer SML, a first conductive layer Gate1, a second conductive layer Gate2, and a first signal line layer SLL1. The display substrate further includes an insulating layer IN between the first conductive layer Gate1 and the second conductive layer Gate2; and an inter-layer dielectric layer ILD between the second conductive layer Gate2 and the first signal line layer SLL1.

Figure 9B:
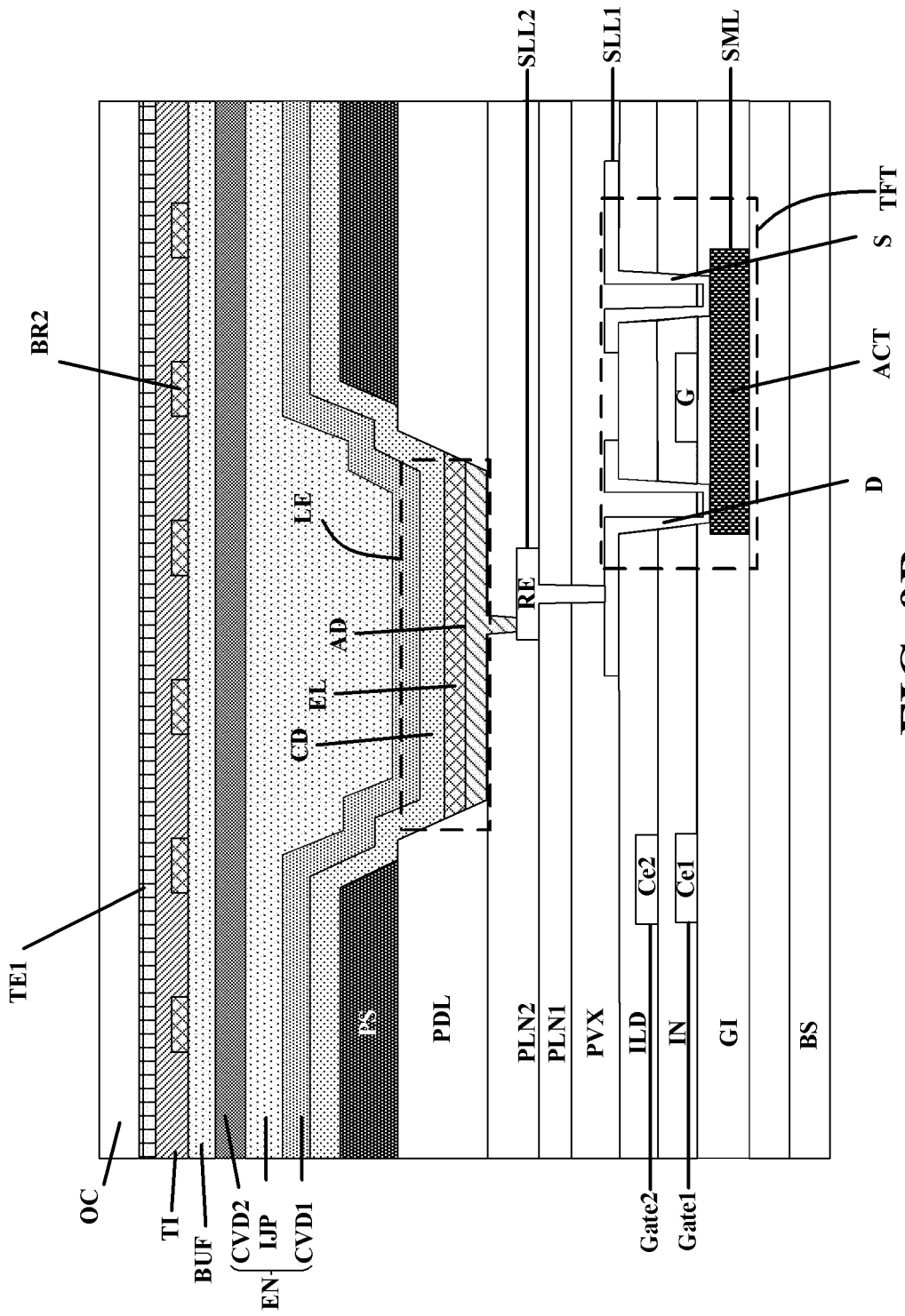
FIG. 9B illustrates a detailed structure in a display region in a display substrate in some embodiments according to the present disclosure.

FIG. 9B illustrates a detailed structure in a display region in a display substrate in some embodiments according to the present disclosure. Referring to FIG. 9B, the display substrate in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a first electrode S and a second electrode D (parts of a first SD metal layer) on a side of the inter-layer dielectric layer ILD away from the gate insulating layer GI; a passivation layer PVX on a side of the first electrode S and the second electrode D away from the inter-layer dielectric layer ILD; a first planarization layer PLN1 on a side of the passivation layer PVX away from the inter-layer dielectric layer ILD; a relay electrode RE (part of a second SD metal layer) on a side of the first planarization layer PLN1 away from the passivation layer PVX; a second planarization layer PLN2 on side of the relay electrode RE away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display substrate in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display substrate in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the display substrate in the display region does not include the passivation layer PVX, e.g., the inter-layer dielectric layer ILD is in direct contact with the first planarization layer PLN1.

Referring to FIG. 9B, the display substrate includes a semiconductor material layer SML, a first conductive layer Gate1, a second conductive layer Gate2, a first signal line layer SLL1, and a second signal line layer SLL2. The display substrate further includes an insulating layer IN between the first conductive layer Gate1 and the second conductive layer Gate2; an inter-layer dielectric layer ILD between the second conductive layer Gate2 and the first signal line layer SLL1; and at least a passivation layer PVX or a planarization layer PLN between the first signal line layer SLL1 and the second signal line layer SLL2.

Figure 10A:
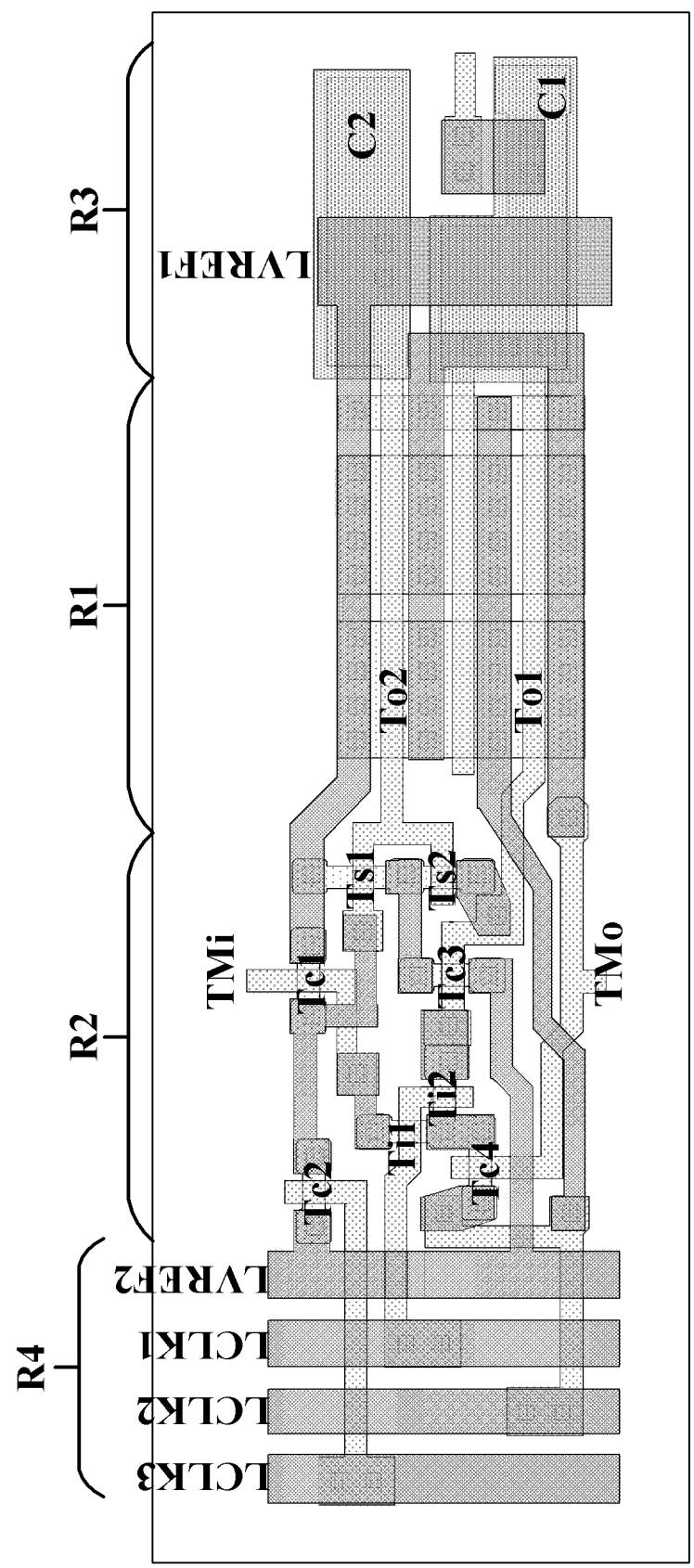
FIG. 10A illustrates the structure of an n-th stage scan unit in some embodiments according to the present disclosure.
Figure 10B:
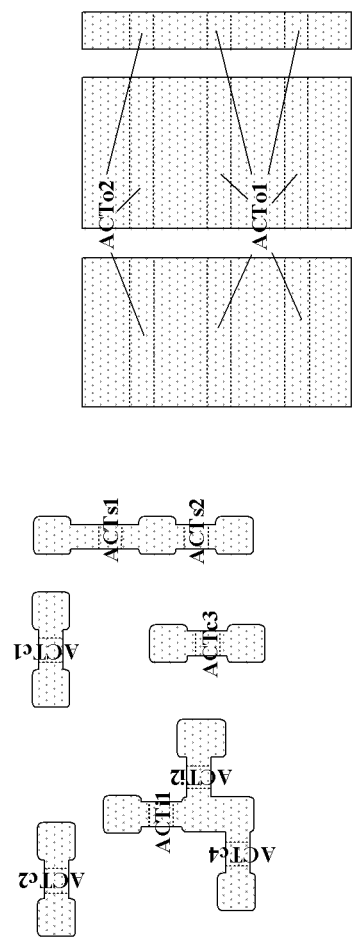
FIG. 10B illustrates the structure of a semiconductor material layer in the n-th stage scan unit depicted in FIG. 10A.
Figure 10C:
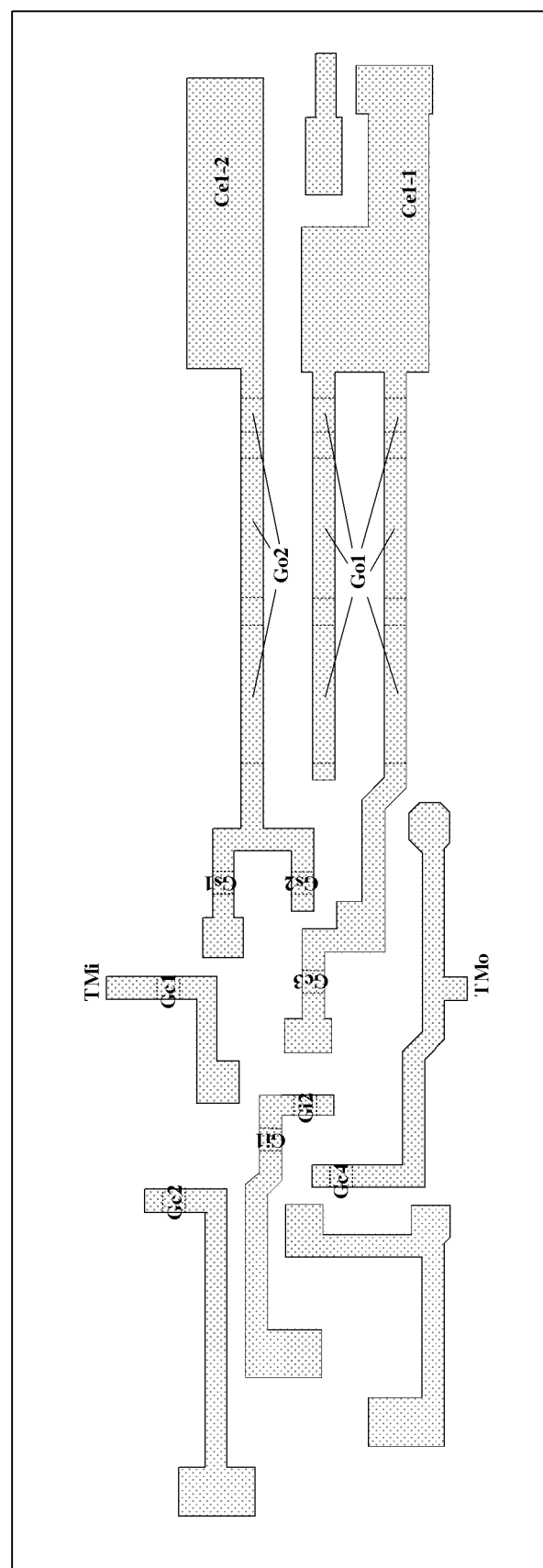
FIG. 10C illustrates the structure of a first conductive layer in the n-th stage scan unit depicted in FIG. 10A.
Figure 10D:
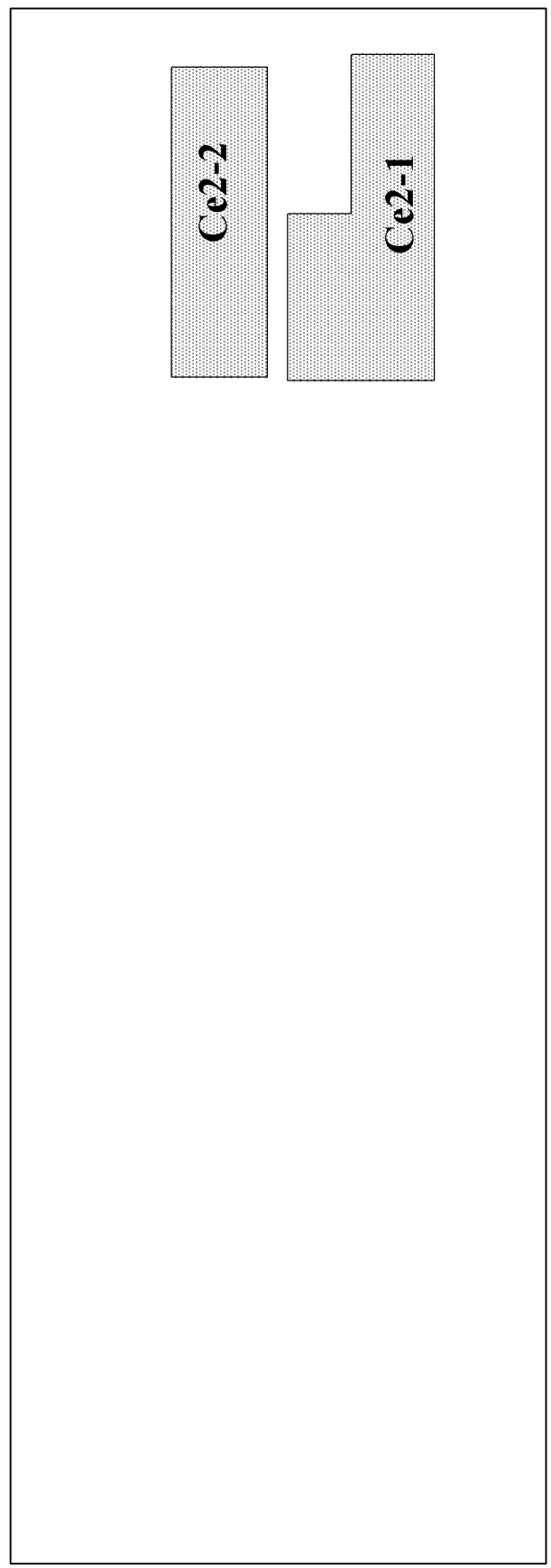
FIG. 10D illustrates the structure of a second conductive layer in the n-th stage scan unit depicted in FIG. 10A.
Figure 10E:
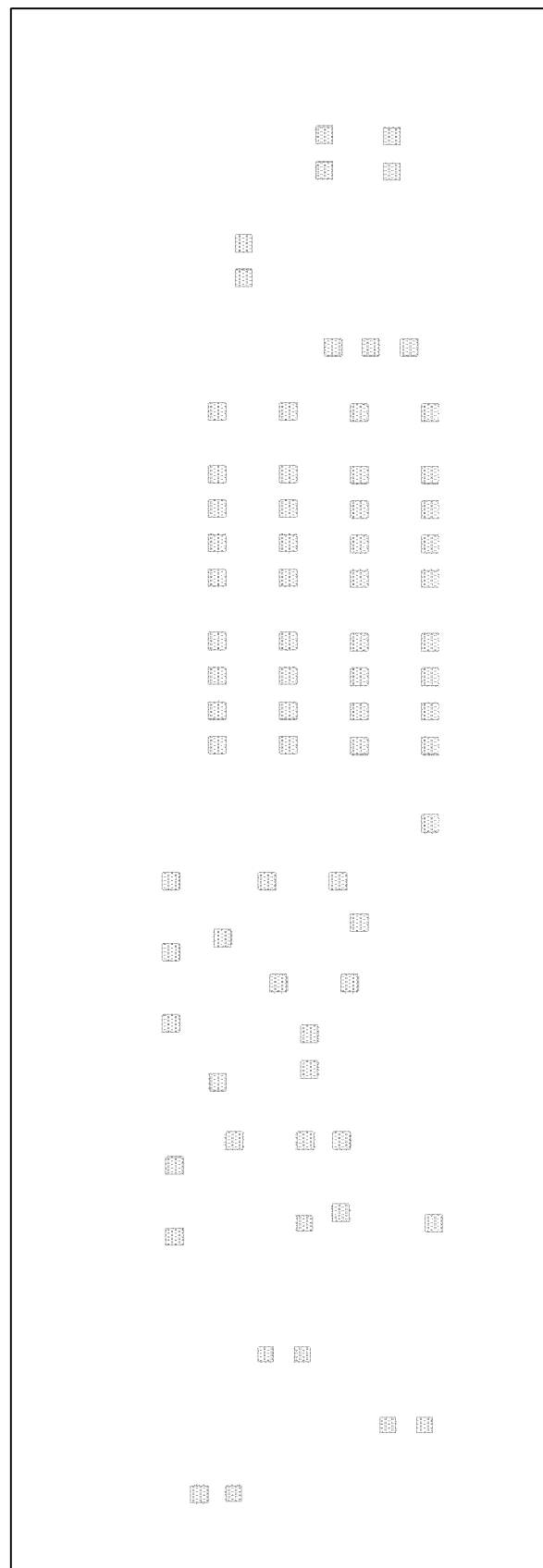
FIG. 10E illustrates the structure of an inter-layer dielectric layer in the n-th stage scan unit depicted in FIG. 10A.
Figure 10F:
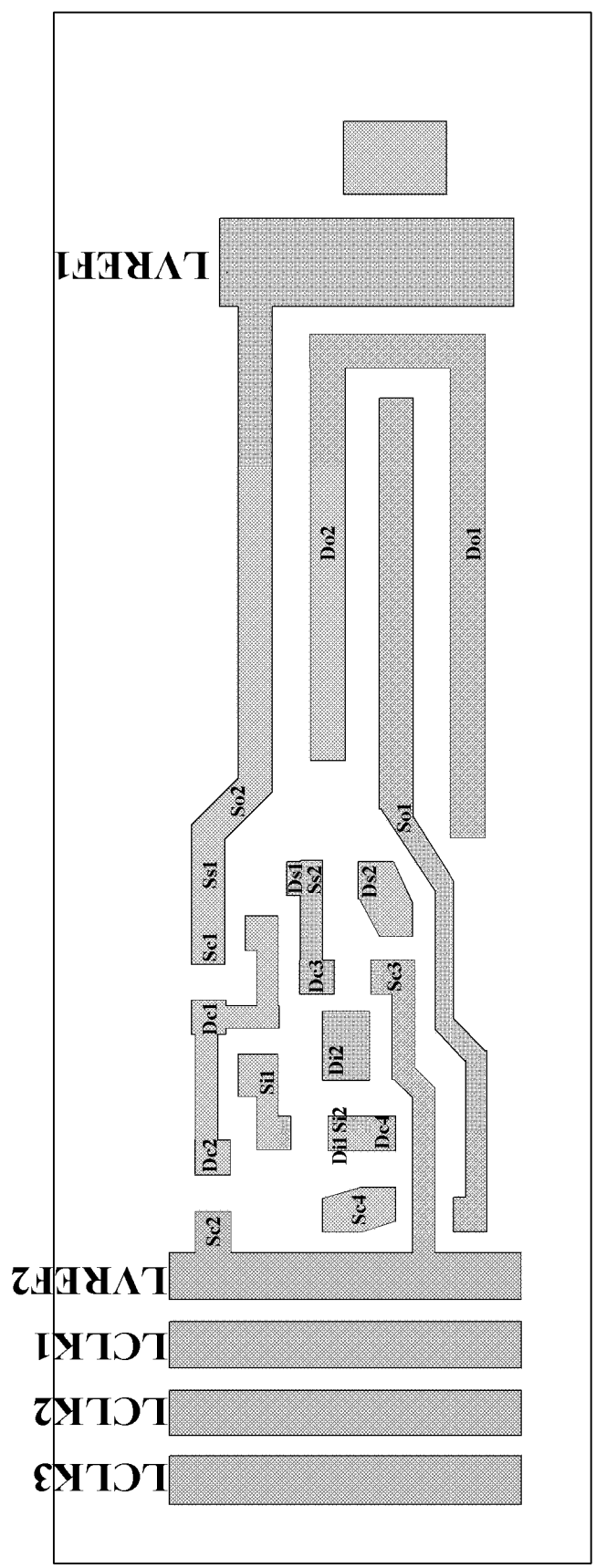
FIG. 10F illustrates the structure of a first signal line layer in the n-th stage scan unit depicted in FIG. 10A.

FIG. 10A illustrates the structure of an n-th stage scan unit in some embodiments according to the present disclosure. FIG. 10B illustrates the structure of a semiconductor material layer in the n-th stage scan unit depicted in FIG. 10A. FIG. 10C illustrates the structure of a first conductive layer in the n-th stage scan unit depicted in FIG. 10A. FIG. 10D illustrates the structure of a second conductive layer in the n-th stage scan unit depicted in FIG. 10A. FIG. 10E illustrates the structure of an inter-layer dielectric layer in the n-th stage scan unit depicted in FIG. 10A. FIG. 10F illustrates the structure of a first signal line layer in the n-th stage scan unit depicted in FIG. 10A. The positions of the transistors and the capacitors of the n-th stage scan unit are annotated in FIG. 10A.

Figure 11A:
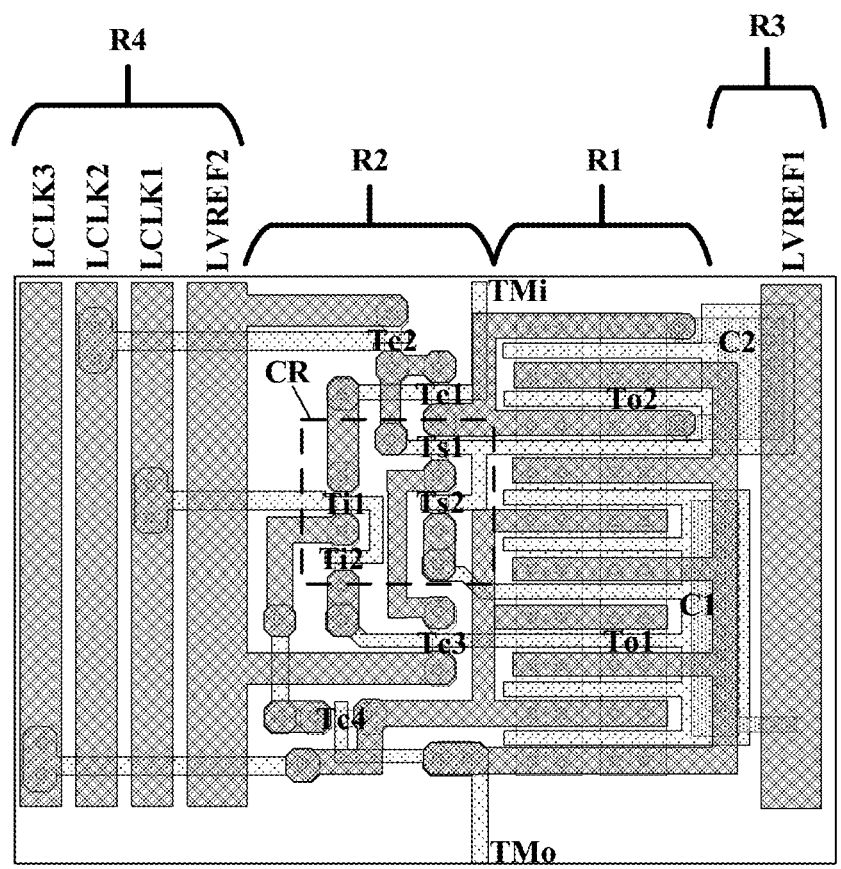
FIG. 11A illustrates the structure of an n-th stage scan unit in some embodiments according to the present disclosure.
Figure 11B:
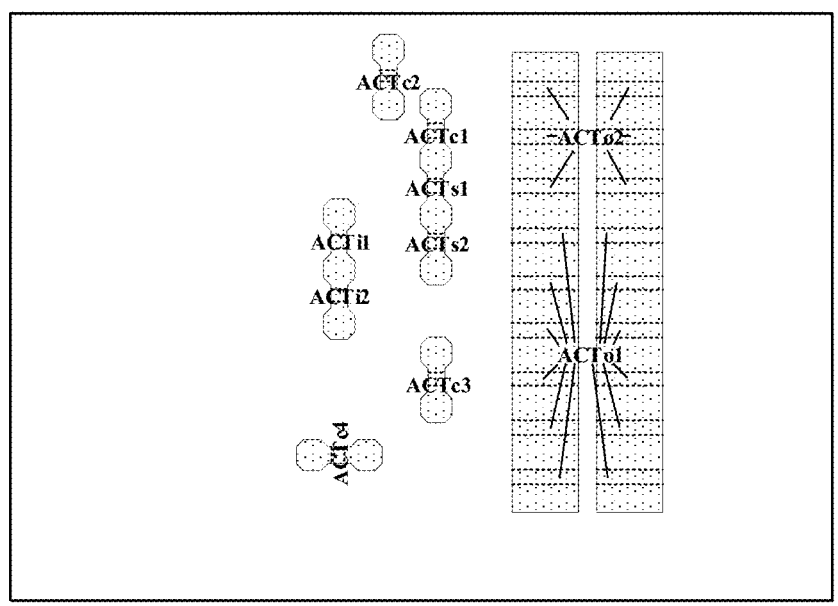
FIG. 11B illustrates the structure of a semiconductor material layer in the n-th stage scan unit depicted in FIG. 11A.
Figure 11C:
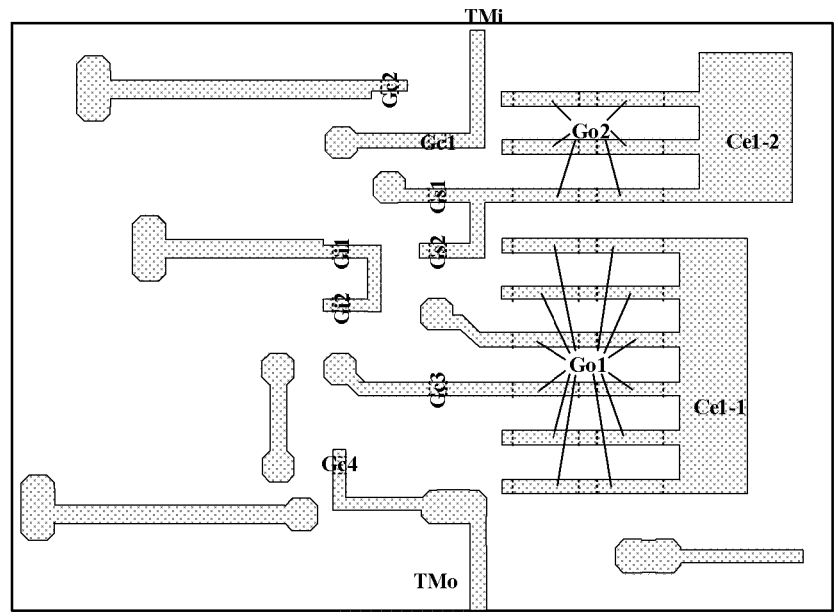
FIG. 11C illustrates the structure of a first conductive layer in the n-th stage scan unit depicted in FIG. 11A.
Figure 11D:
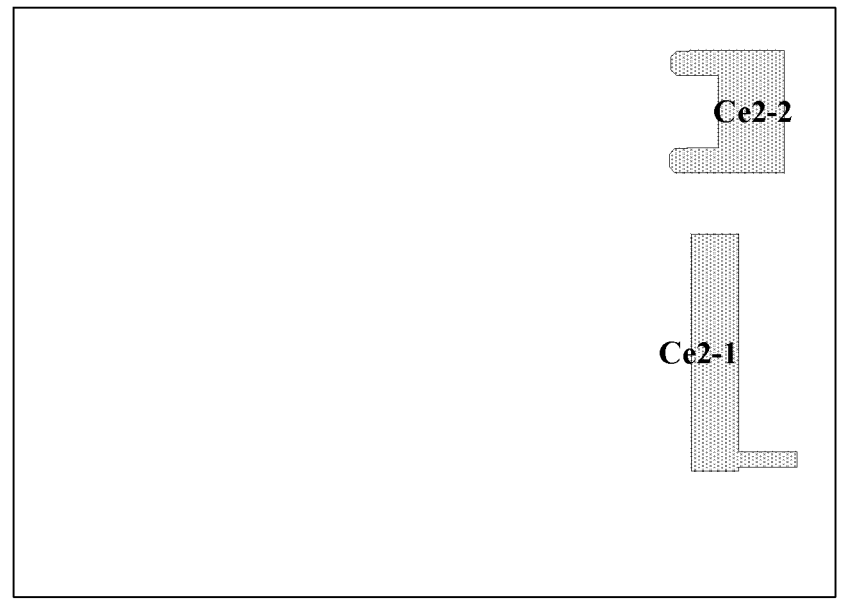
FIG. 11D illustrates the structure of a second conductive layer in the n-th stage scan unit depicted in FIG. 11A.
Figure 11E:
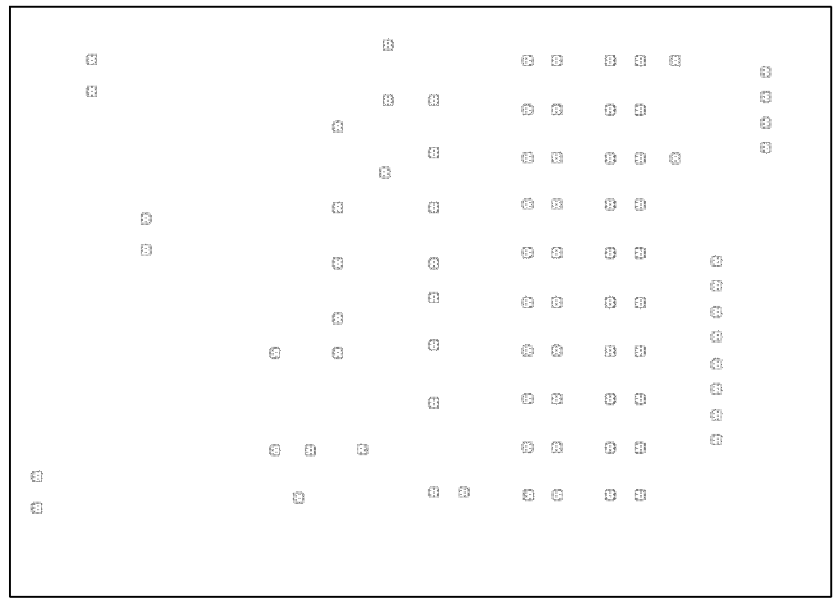
FIG. 11E illustrates the structure of an inter-layer dielectric layer in the n-th stage scan unit depicted in FIG. 11A.
Figure 11F:
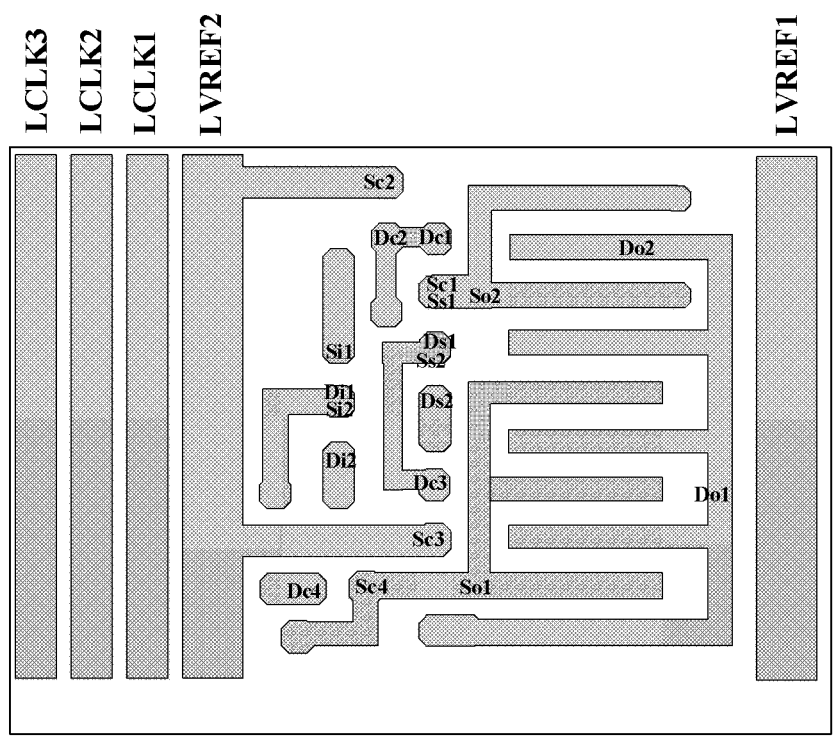
FIG. 11F illustrates the structure of a first signal line layer in the n-th stage scan unit depicted in FIG. 11A.

FIG. 11A illustrates the structure of an n-th stage scan unit in some embodiments according to the present disclosure. FIG. 11B illustrates the structure of a semiconductor material layer in the n-th stage scan unit depicted in FIG. 11A. FIG. 11C illustrates the structure of a first conductive layer in the n-th stage scan unit depicted in FIG. 11A. FIG. 11D illustrates the structure of a second conductive layer in the n-th stage scan unit depicted in FIG. 11A. FIG. 11E illustrates the structure of an inter-layer dielectric layer in the n-th stage scan unit depicted in FIG. 11A. FIG. 11F illustrates the structure of a first signal line layer in the n-th stage scan unit depicted in FIG. 11A. The positions of the transistors and the capacitors of the n-th stage scan unit are annotated in FIG. 11A.

Figure 12A:
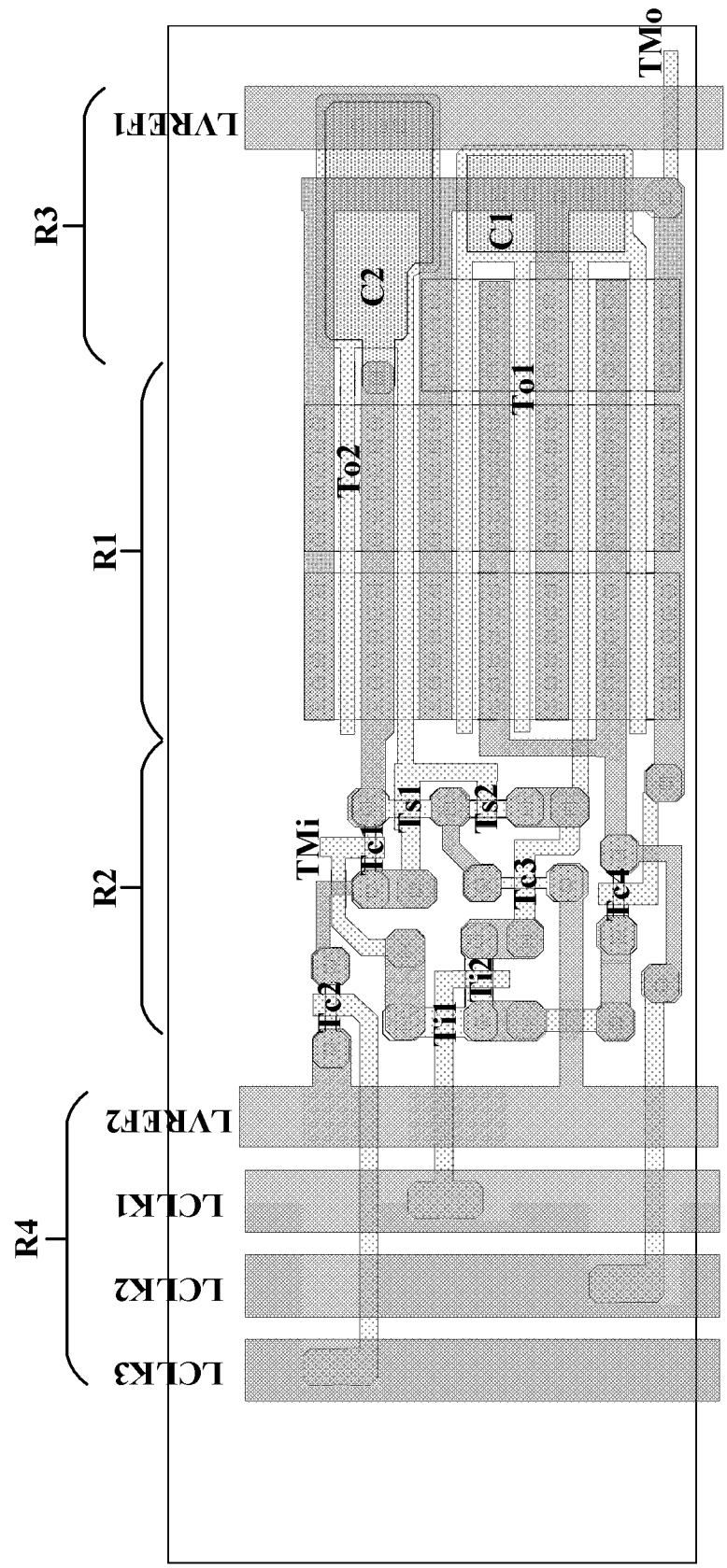
FIG. 12A illustrates the structure of an n-th stage scan unit in some embodiments according to the present disclosure.
Figure 12B:
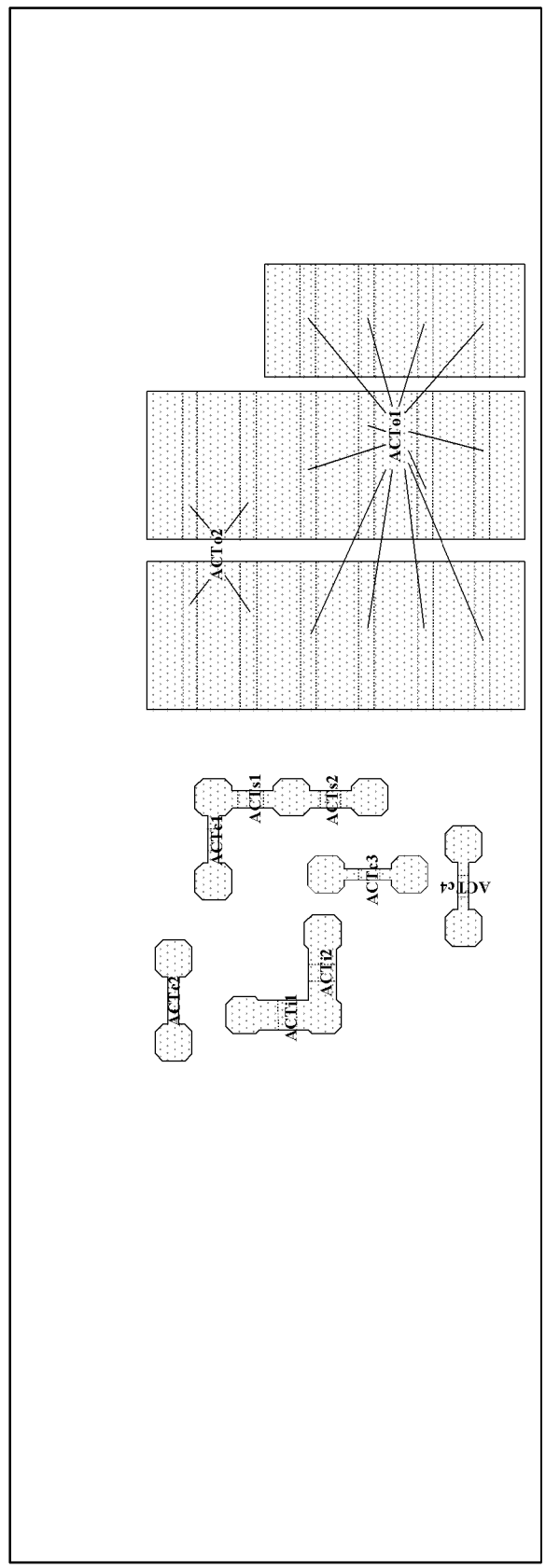
FIG. 12B illustrates the structure of a semiconductor material layer in the n-th stage scan unit depicted in FIG. 12A.
Figure 12C:
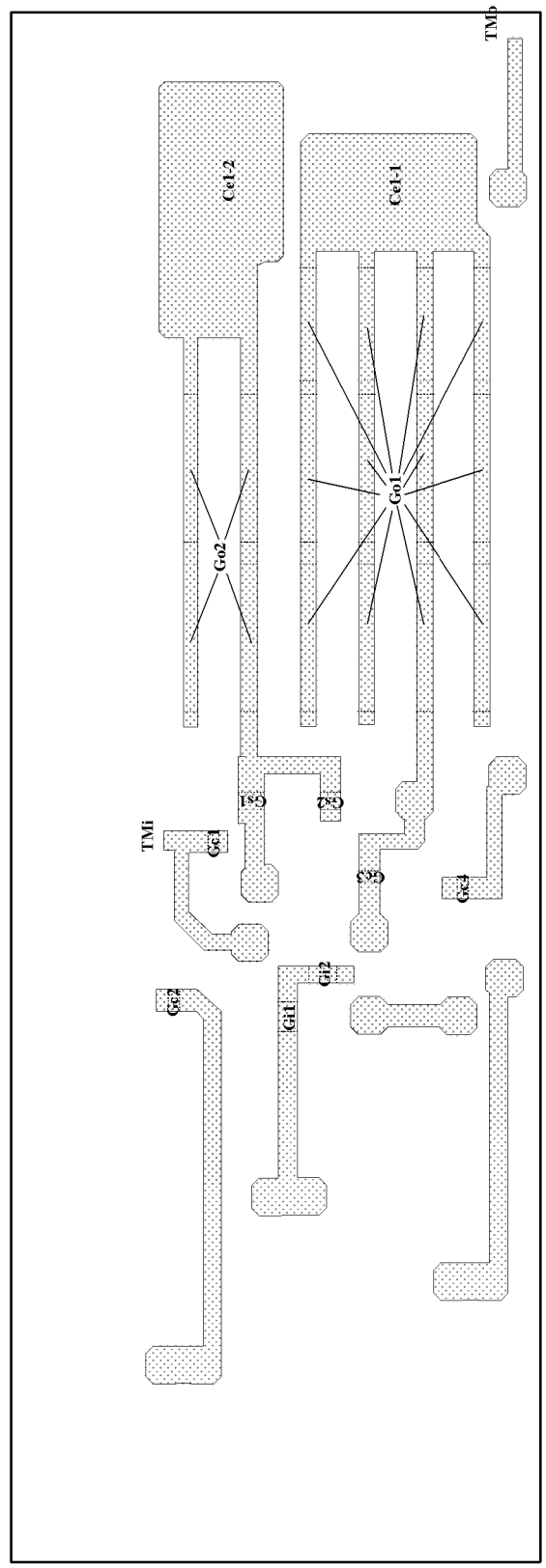
FIG. 12C illustrates the structure of a first conductive layer in the n-th stage scan unit depicted in FIG. 12A.
Figure 12D:
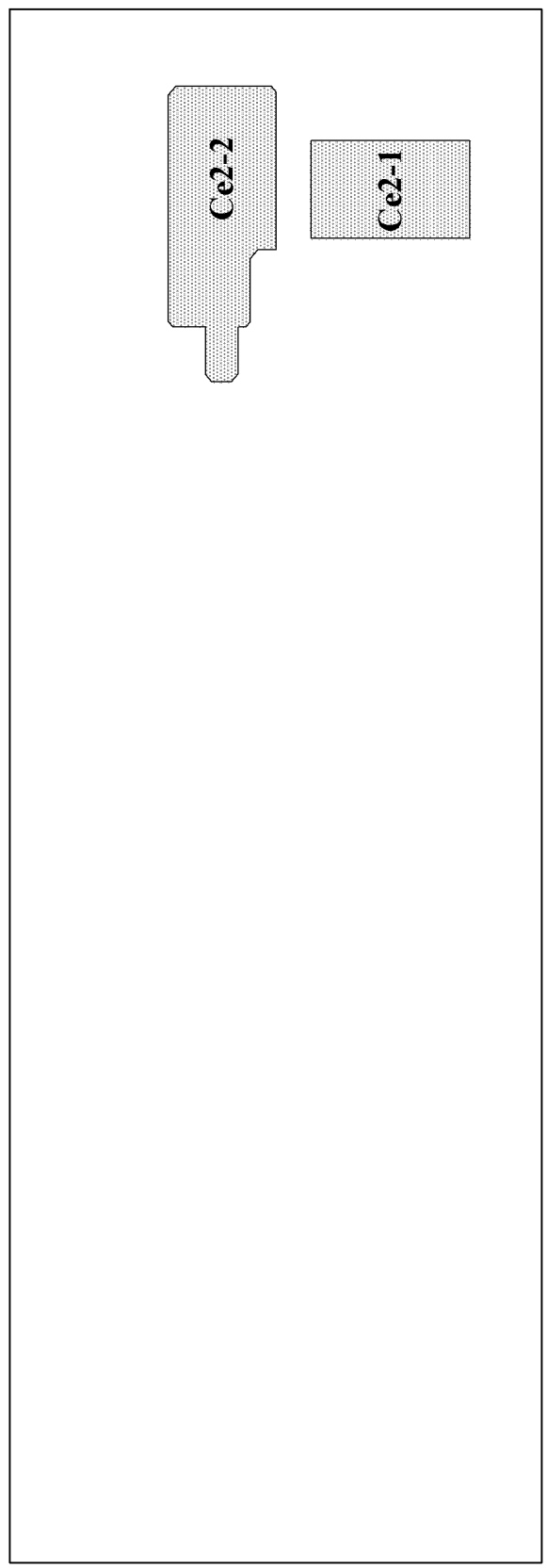
FIG. 12D illustrates the structure of a second conductive layer in the n-th stage scan unit depicted in FIG. 12A.
Figure 12E:
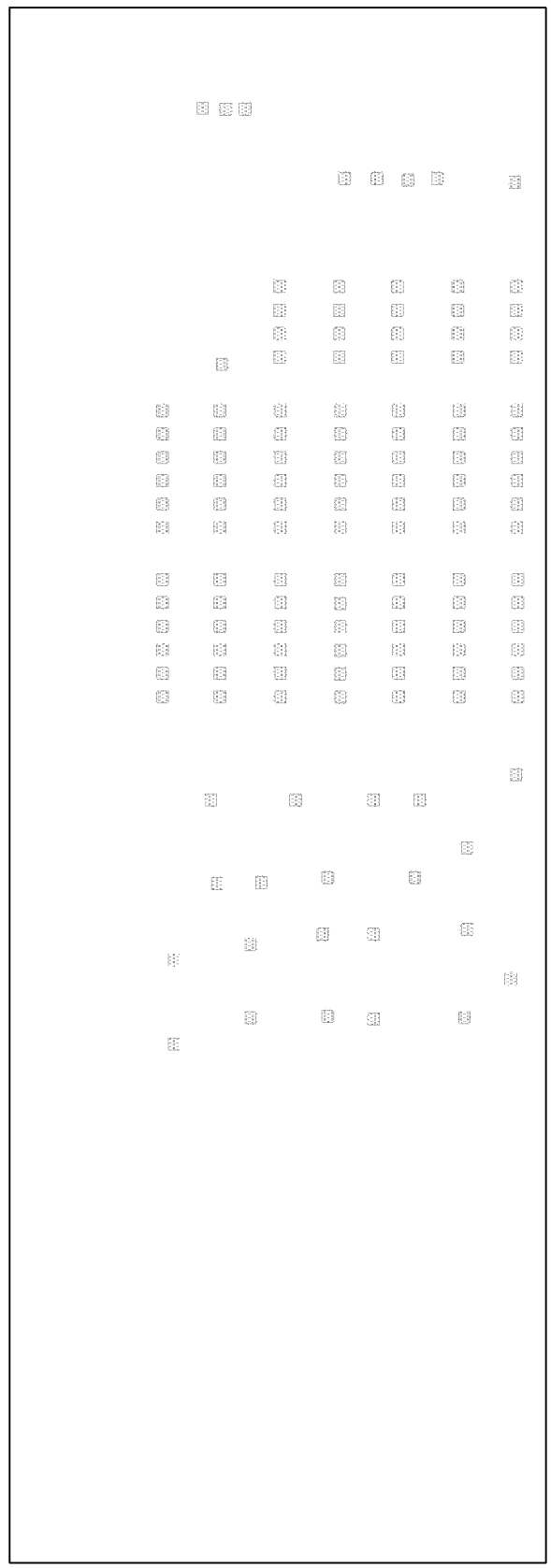
FIG. 12E illustrates the structure of an inter-layer dielectric layer in the n-th stage scan unit depicted in FIG. 12A.
Figure 12F:
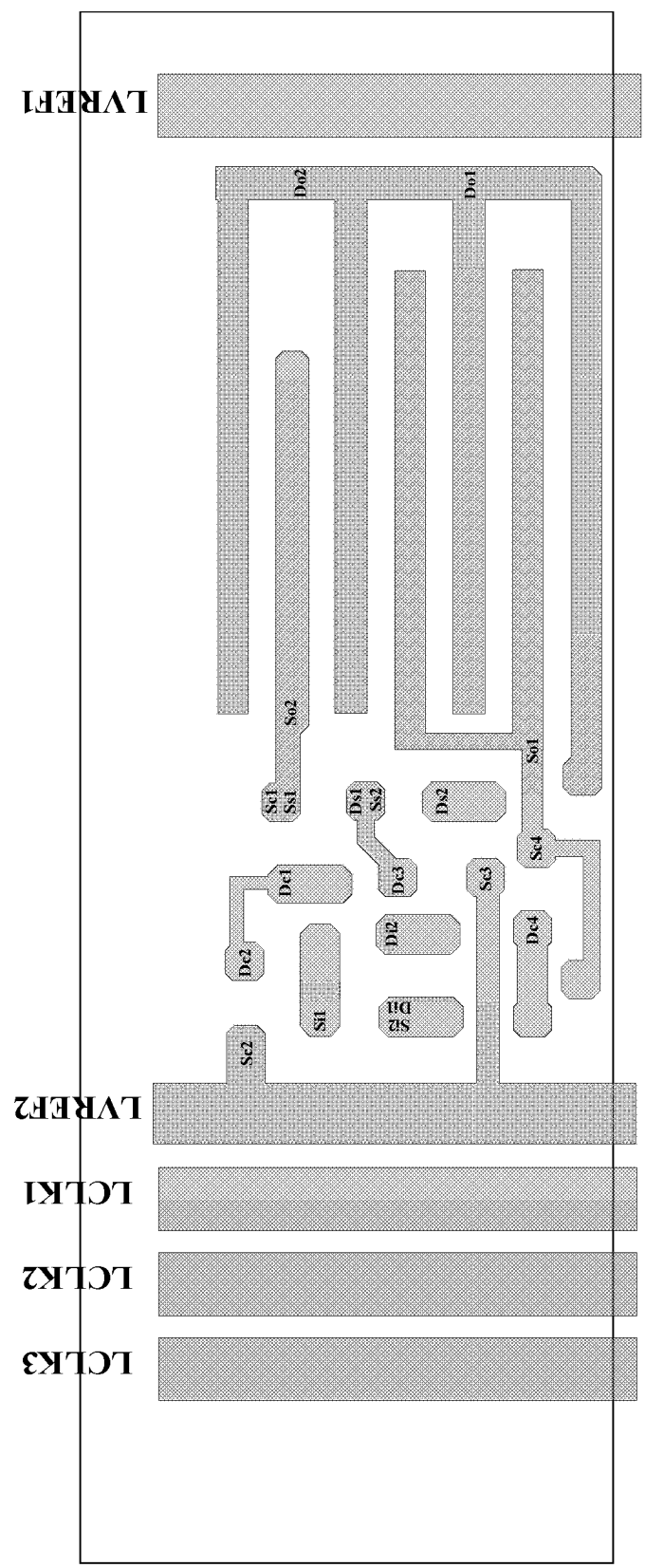
FIG. 12F illustrates the structure of a first signal line layer in the n-th stage scan unit depicted in FIG. 12A.

FIG. 12A illustrates the structure of an n-th stage scan unit in some embodiments according to the present disclosure. FIG. 12B illustrates the structure of a semiconductor material layer in the n-th stage scan unit depicted in FIG. 12A. FIG. 12C illustrates the structure of a first conductive layer in the n-th stage scan unit depicted in FIG. 12A. FIG. 12D illustrates the structure of a second conductive layer in the n-th stage scan unit depicted in FIG. 12A. FIG. 12E illustrates the structure of an inter-layer dielectric layer in the n-th stage scan unit depicted in FIG. 12A. FIG. 12F illustrates the structure of a first signal line layer in the n-th stage scan unit depicted in FIG. 12A. The positions of the transistors and the capacitors of the n-th stage scan unit are annotated in FIG. 12A.

Referring to FIG. 10B, FIG. 11B, or FIG. 12B, the semiconductor material layer (e.g., corresponding to SML in FIG. 9A to FIG. 9B) includes active layers of the transistors in the n-th stage scan unit. Active layers of the transistors are annotated in FIG. 10B, FIG. 11B, or FIG. 12B. Referring to FIG. 10A, FIG. 11A, FIG. 12A, FIG. 10B, FIG. 11B, and FIG. 12B, in some embodiments, the active layer ACTi1 of the first input transistor Ti1, the active layer ACTi2 of the second input transistor Ti2, the active layer ACTc1 of the first control transistor Tc1, the active layer ACTc2 of the second control transistor Tc2, the active layer ACTc3 of the third control transistor Tc3, the active layer ACTs1 of the first switch transistor Ts1, the active layer ACTs2 of the second switch transistor Ts2, the active layer ACTo1 of the first output transistor To1, the active layer ACTo2 of the second output transistor To2, are in a same layer.

In one example, the first output transistor To1 is a multi-gate transistor, and the active layer ACTo1 of the first output transistor To1 includes multiple portions spaced apart from each other, as depicted in FIG. 10B, FIG. 11B, or FIG. 12B. In another example, the second output transistor To2 is a multi-gate transistor, and the active layer ACTo2 of the second output transistor To2 includes multiple portions spaced apart from each other, as depicted in FIG. 10B, FIG. 11B, or FIG. 12B.

In one example, the active layers of the first input transistor Ti1 and the second input transistor Ti2 are parts of a unitary structure. In another example, the active layers of the first switch transistor Ts1 and the second switch transistor Ts2 are parts of a unitary structure. Referring to FIG. 10B, in another example, the active layers of the first input transistor Ti1, the second input transistor Ti2, and the fourth control transistor Tc4 are parts of a unitary structure. Referring to FIG. 11B, in another example, the active layers of the first switch transistor Ts1, the second switch transistor Ts2, and the first control transistor Tc1 are parts of a unitary structure.

As used herein, the term "same layer" refers to the relationship between the layers simultaneously formed in the same step. In one example, the active layers of transistors are in a same layer when they are formed as a result of one or more steps of a same patterning process performed in a same layer of material. In another example, the active layers can be formed in a same layer by simultaneously performing the step of forming a first active layer, and the step of forming a second active layer. The term "same layer" does not always mean that the thickness of the layer or the height of the layer in a cross-sectional view is the same.

As used herein, the active layer refers to a component of the transistor comprising at least a portion of the semiconductor material layer whose orthographic projection on the base substrate overlaps with an orthographic projection of a gate electrode on the base substrate. As used herein, a first electrode refers to a component of the transistor connected to one side of the active layer, and a second electrode refers to a component of the transistor connected to another side of the active layer.

Referring to FIG. 10C, FIG. 11C, or FIG. 12C, the first conductive layer (e.g., corresponding to Gate1 in FIG. 9A to FIG. 9B) in some embodiments includes gate electrodes of transistor in the n-th stage scan unit. Gate electrodes of the transistors are annotated in FIG. 10C, FIG. 11C, or FIG. 12C. Referring to FIG. 10A, FIG. 11A, FIG. 12A, FIG. 10C, FIG. 11C, and FIG. 12C, in some embodiments, the gate electrode Gi1 of the first input transistor Ti1, the gate electrode Gi2 of the second input transistor Ti2, the gate electrode Gc1 of the first control transistor Tc1, the gate electrode Gc2 of the second control transistor Tc2, the gate electrode Gc3 of the third control transistor Tc3, the gate electrode Gs1 of the first switch transistor Ts1, the gate electrode Gs2 of the second switch transistor Ts2, the gate electrode Go1 of the first output transistor To1, and the gate electrode Go2 of the second output transistor To2, are in a same layer.

In one example, the first output transistor To1 is a multi-gate transistor, and the gate electrode Go1 of the first output transistor To1 includes multiple portions spaced apart from each other, as depicted in FIG. 10C, FIG. 11C, or FIG. 12C. In another example, the second output transistor To2 is a multi-gate transistor, and the gate electrode Go2 of the second output transistor To2 includes multiple portions spaced apart from each other, as depicted in FIG. 10C, FIG. 11C, or FIG. 12C.

In one example, the gate electrodes of the first input transistor Ti1 and the second input transistor Ti2 are parts of a unitary structure. In another example, the gate electrodes of the first switch transistor Ts1 and the second switch transistor Ts2 are parts of a unitary structure. Referring to FIG. 10B, in another example, the gate electrodes of the first input transistor Ti1, the second input transistor Ti2, and the fourth control transistor Tc4 are parts of a unitary structure. Referring to FIG. 11B, in another example, the gate electrodes of the first switch transistor Ts1, the second switch transistor Ts2, and the first control transistor Tc1 are parts of a unitary structure.

In some embodiments, the first conductive layer further includes first capacitor electrodes of capacitors in the n-th stage scan unit. First capacitor electrodes of capacitors are annotated in FIG. 10C, FIG. 11C, or FIG. 12C. Referring to FIG. 10A, FIG. 11A, FIG. 12A, FIG. 10C, FIG. 11C, and FIG. 12C, in some embodiments, a first capacitor electrode Ce1-1 of the first capacitor C1 and a first capacitor electrode Ce2-1 of the second capacitor C2 are in a same layer. Optionally, the first capacitor electrode Ce1-1 of the first capacitor C1 and the gate electrode Go1 of the first output transistor To1 are parts of a unitary structure. Optionally, the first capacitor electrode Ce2-1 of the second capacitor C2, the gate electrode Go2 of the second output transistor To2 are parts of a unitary structure.

The first conductive layer in some embodiments further includes an input signal line configured to receive a start signal STV or an output signal G_(n−1) from a previous scan unit of a previous stage as input at the input terminal TMi; and an output signal line configured to output an output signal G_n at the output terminal TMo.

Referring to FIG. 10D, FIG. 11D, or FIG. 12D, the second conductive layer (e.g., corresponding to Gate2 in FIG. 9A to FIG. 9B) includes second capacitor electrodes of capacitors in the n-th stage scan unit. Second capacitor electrodes of capacitors are annotated in FIG. 10D, FIG. 11D, or FIG. 12D. Referring to FIG. 10A, FIG. 11A, FIG. 12A, FIG. 10D, FIG. 11D, and FIG. 12D, in some embodiments, a second capacitor electrode Ce1-2 of the first capacitor C1 and a second capacitor electrode Ce2-2 of the second capacitor C2 are in a same layer.

Referring to FIG. 10F, FIG. 11F, or FIG. 12F, the first signal line layer (e.g., corresponding to SLL1 in FIG. 9A to FIG. 9B) includes source electrodes and drain electrodes of transistors in the n-th stage scan unit. Referring to FIG. 10A, FIG. 11A, FIG. 12A, FIG. 10F, FIG. 11F, and FIG. 12F, in some embodiments, the source electrode Si1 of the first input transistor Ti1, the source electrode Si2 of the second input transistor Ti2, the source electrode Sc1 of the first control transistor Tc1, the source electrode Sc2 of the second control transistor Tc2, the source electrode Sc3 of the third control transistor Tc3, the source electrode Ss1 of the first switch transistor Ts1, the source electrode Ss2 of the second switch transistor Ts2, the source electrode So1 of the first output transistor To1, and the source electrode So2 of the second output transistor To2, the drain electrode Di1 of the first input transistor Ti1, the drain electrode Di2 of the second input transistor Ti2, the drain electrode Dc1 of the first control transistor Tc1, the drain electrode Dc2 of the second control transistor Tc2, the drain electrode Dc3 of the third control transistor Tc3, the drain electrode Ds1 of the first switch transistor Ts1, the drain electrode Ds2 of the second switch transistor Ts2, the drain electrode Do1 of the first output transistor To1, and the drain electrode Do2 of the second output transistor To2, are in a same layer.

In some embodiments, the first signal line layer further includes a first clock signal line LCLK1 configured to provide a first clock signal CLK1, a second clock signal line LCLK2 configured to provide a second clock signal CLK2, a third clock signal line LCLK3 configured to provide a third clock signal CLK3, a first reference signal line LVREF1 configured to provide a first reference signal VREF1, and a second reference signal line LVREF2 configured to provide a second reference signal VREF2.

Referring to FIG. 10A, FIG. 11A, and FIG. 12A, in some embodiments, the first output transistor To1 and the second output transistor To2 are arranged in a first region R1 between a second region R2 and a third region R3. Transistors other than the first output transistor To1 and the second output transistor To2 are arranged in the second region. The first capacitor C1 and the second capacitor C2 are arranged in the third region R3. Optionally, the first reference signal line LVREF1 is also disposed in the third region R3.

In some embodiments, at least the clock signal lines (e.g., the first clock signal line LCLK1, the second clock signal line LCLK2, and the third clock signal line LCLK3) are arranged in a fourth region R4. The second region R2 is between the fourth region R4 and the first region R1. Optionally, the fourth region R4, the second region R2, the first region R1, and the third region R3 are sequentially arranged. Optionally, the second reference signal line LVREF2 is also disposed in the fourth region R4.

The first reference signal line LVREF1 may be disposed in various appropriate positions. In one example, the first reference signal line LVREF1 is in the third region R3. In another example, an orthographic projection of the first reference signal line LVREF1 on a base substrate at least partially overlaps with an orthographic projection of the first capacitor C1 or the second capacitor C2 on the base substrate. In another example, the first reference signal line LVREF1 is in the first region R1. In another example, an orthographic projection of the first reference signal line LVREF1 on a base substrate at least partially overlaps with an orthographic projection of the first output transistor To1 or the second output transistor To2 on the base substrate.

The second reference signal line LVREF2 may be disposed in various appropriate positions. In one example, the second reference signal line LVREF2 is in the fourth region R4. In another example, the second reference signal line LVREF2 is in the second region R2. In another example, an orthographic projection of the second reference signal line LVREF2 on a base substrate at least partially overlaps with an orthographic projection of at least one transistor (e.g., a transistor other than the output transistors) on the base substrate.

In some embodiments, transistors of the respective scan unit in the second region R2 are arranged so that the first input transistor Ti1 and the second input transistor Ti2 are on a side of the first switch transistor Ts1 and the second switch transistor Ts2 closer to the clock signal lines, and the first switch transistor Ts1 and the second switch transistor Ts2 are on a side of the first input transistor Ti1 and the second input transistor Ti2 closer to the output transistors.

In some embodiments, the first input transistor Ti1, the second input transistor Ti2, the first switch transistor Ts1, and the second switch transistor Ts2 are clustered in a central region CR, the first control transistor Tc1 and the second control transistor Tc2 are on a first side of the central region CR, the third control transistor Tc3 and the fourth control transistor Tc4 are on a second side of the central region CR. The first side and the second side are two opposite sides with respect to the central region CR along an extension direction of the clock signal lines or the reference signal lines.

In some embodiments, the second control transistor Tc2 is on a side of the first control transistor Tc1 closer to the clock signal lines, and the first control transistor Tel is on a side of the second control transistor Tc2 closer to the output transistors.

In some embodiments, at least a portion of a unitary structure comprising the active layer ACTi1 of the first input transistor Ti1 and the active layer ACTi2 of the second input transistor Ti2 has a L shape or an I shape. In one example, the unitary structure includes the active layer ACTi1 of the first input transistor Ti1, the active layer ACTi2 of the second input transistor Ti2, and the active layer ACTc4 of the fourth control transistor Tc4.

In some embodiments, at least a portion of a unitary structure comprising the active layer ACTs1 of the first switch transistor Ts1 and the active layer ACTs2 of the second switch transistor Ts2 has a L shape or an I shape. In one example, the unitary structure includes the active layer ACTs1 of the first switch transistor Ts1, the active layer ACTs2 of the second switch transistor Ts2, and the active layer ACTc1 of the first control transistor Tc1.

In some embodiments, the first output transistor To1 has a first occupied area, the second output transistor To2 has a second occupied area, the first occupied area being greater than the second occupied area. Optionally, a ratio of the first occupied area to the second occupied area is greater than or equal to 1.5:1, e.g., greater than or equal to 1.6:1, greater than or equal to 1.7:1, greater than or equal to 1.8:1, greater than or equal to 1.9:1, or greater than or equal to 2.0:1.

In some embodiments, the active layer ACTo1 of the first output transistor To1 has a first channel width, the active layer ACTo2 of the second output transistor To2 has a second channel width, and the first channel width being greater than the second channel width. As used herein, in the context of multi-gate transistors, the active layer of a multi-gate transistor includes multiple portions spaced apart from each other, as depicted in FIG. 10B, FIG. 11B, or FIG. 12B. A channel width of the active layer of a multi-gate transistor is a sum of channel widths of the multiple portions.

Optionally, a ratio of the first channel width to the second channel width is greater than or equal to 1.5:1, e.g., greater than or equal to 1.6:1, greater than or equal to 1.7:1, greater than or equal to 1.8:1, greater than or equal to 1.9:1, or greater than or equal to 2.0:1.

In another aspect, the present invention provides a display apparatus, including the scan circuit or display substrate described herein or fabricated by a method described herein, and one or more integrated circuits. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus. Optionally, the display apparatus is a quantum dots display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A scan circuit, comprising a plurality of stages, wherein a respective stage of the scan circuit comprises a respective scan unit configured to provide a control signal to at least a row of subpixels;
   wherein the respective scan unit comprises an input subcircuit configured to receive from an input terminal a start signal or an output signal from a previous scan unit of a previous stage, a first processing subcircuit, a second processing subcircuit, and an output subcircuit configured to output an output signal from an output terminal;
   wherein the output subcircuit comprises a first output transistor;
   wherein the input subcircuit comprises a first input transistor and a second input transistor sequentially coupled between an input terminal and a first node; and
   the first node is coupled to a gate electrode of the first output transistor;
   wherein the first processing subcircuit comprises a first switch transistor and a second switch transistor coupled between the first node and a first reference terminal; and
   the first reference terminal is configured to receive a first reference signal;
   wherein the first processing subcircuit further comprises a first control transistor coupled between a second node and the first reference terminal;
   a gate electrode of the first control transistor is coupled to the input terminal, and is configured to receive the start signal or the output signal from the previous scan unit of the previous stage;
   a source electrode of the first control transistor is coupled to the first reference terminal, and is configured to receive the first reference signal; and
   a drain electrode of the first control transistor is coupled to the second node, which is coupled to gate electrodes of the first switch transistor and the second switch transistor.

2. The scan circuit of claim 1, wherein gate electrodes of the first input transistor and the second input transistor are coupled to a first terminal, and are configured to receive a first clock signal from the first terminal; and
   a source electrode of the first output transistor is coupled to a second terminal, and is configured to receive a second clock signal from the second terminal.

3. The scan circuit of claim 1, wherein the second processing subcircuit comprises a second control transistor coupled between a second node and a second reference terminal;
   the second reference terminal is configured to receive a second reference signal; and
   a gate electrode of the second control transistor is coupled to a third terminal, and is configured to receive a third clock signal from the third terminal.

4. The scan circuit of claim 1, wherein the first processing subcircuit further comprises a third control transistor coupled between a third node and a second reference terminal;
   a gate electrode of the third control transistor is coupled to the first node;
   a source electrode of the third control transistor is coupled to the second reference terminal, and is configured to receive a second reference signal from the second reference terminal; and
   a drain electrode of the third control transistor is coupled to a drain electrode of the first switch transistor and a source electrode of the second switch transistor.

5. The scan circuit of claim 1, wherein the input subcircuit further comprises a fourth control transistor coupled between a fourth node and a second terminal;
the second terminal is configured to receive a second clock signal;
the fourth node is coupled to a drain electrode of the first input transistor and a source electrode of the second input transistor; and
a gate electrode of the fourth control transistor is coupled to the output terminal, and is configured to receive the output signal from the output terminal.

6. The scan circuit of claim 1, wherein the output subcircuit further comprises a second output transistor coupled between the first reference terminal and the output terminal; and
a gate electrode of the second output transistor is coupled to gate electrodes of the first switch transistor and the second switch transistor.

7. A display substrate, comprising:
a scan circuit;
wherein the scan circuit comprises a plurality of stages, wherein a respective stage of the scan circuit comprises a respective scan unit configured to provide a control signal to at least a row of subpixels;
wherein the respective scan unit comprises an input subcircuit configured to receive from an input terminal a start signal or an output signal from a previous scan unit of a previous stage, a first processing subcircuit, a second processing subcircuit, and an output subcircuit configured to output an output signal from an output terminal;
wherein the output subcircuit comprises a first output transistor;
wherein the input subcircuit comprises a first input transistor and a second input transistor sequentially coupled between an input terminal and a first node; and
the first node is coupled to a gate electrode of the first output transistor;
wherein the first processing subcircuit comprises a first switch transistor and a second switch transistor coupled between the first node and a first reference terminal; and
the first reference terminal is configured to receive a first reference signal;
wherein the first output transistor and a second output transistor of the output subcircuit are arranged in a first region;
input transistors, switch transistors, and control transistors of the respective scan unit are arranged in a second region; and
capacitors of the respective scan unit are arranged in a third region;
wherein the display substrate further comprises one or more clock signal lines arranged in a fourth region;
wherein the fourth region, the second region, the first region, and the third region are sequentially arranged.

8. The display substrate of claim 7, wherein, in the second region, the first input transistor and the second input transistor are on a side of the first switch transistor and the second switch transistor closer to one or more clock signal lines; and
the first switch transistor and the second switch transistor are on a side of the first input transistor and the second input transistor closer to the first output transistor and the second output transistor.

9. The display substrate of claim 7, comprising a semiconductor material layer;
wherein the semiconductor material layer comprises active layers of one or more transistors of the respective scan unit;
an active layer of the first input transistor and an active layer of the second input transistor are parts of a first unitary structure in the semiconductor material layer; and
at least a portion of the first unitary structure has a L shape or an I shape.

10. The display substrate of claim 9, wherein the first unitary structure further comprises an active layer of a fourth control transistor.

11. The display substrate of claim 7, comprising a semiconductor material layer;
wherein the semiconductor material layer comprises active layers of one or more transistors of the respective scan unit;
an active layer of the first switch transistor and an active layer of the second switch transistor are parts of a second unitary structure in the semiconductor material layer; and
at least a portion of the second unitary structure has a L shape or an I shape.

12. The display substrate of claim 11, wherein the second unitary structure further includes an active layer of a first control transistor.

13. The display substrate of claim 7, wherein the first output transistor has a first occupied area;
the second output transistor has a second occupied area;
the first occupied area is greater than the second occupied area; and
a ratio of the first occupied area to the second occupied area is greater than or equal to 1.5:1.

14. The display substrate of claim 7, wherein an active layer of the first output transistor has a first channel width;
an active layer of the second output transistor has a second channel width;
the first channel width is greater than the second channel width; and
a ratio of the first channel width to the second channel width is greater than or equal to 1.5:1.

15. The display substrate of claim 7, further comprising a first reference signal line and a second reference signal line;
wherein the first reference signal line is in the third region;
the second reference signal line is in the fourth region; and
transistors of the respective scan unit are between the first reference signal line and the second reference signal line.

16. A display apparatus, comprising the display substrate of claim 7, and one or more integrated circuits connected to the display substrate.

17. A display substrate, comprising:
a scan circuit;
wherein the scan circuit comprises a plurality of stages, wherein a respective stage of the scan circuit comprises a respective scan unit configured to provide a control signal to at least a row of subpixels;
wherein the respective scan unit comprises an input subcircuit configured to receive from an input terminal a start signal or an output signal from a previous scan unit of a previous stage, a first processing subcircuit, a second processing subcircuit, and an output subcircuit configured to output an output signal from an output terminal;

wherein the output subcircuit comprises a first output transistor;
wherein the input subcircuit comprises a first input transistor and a second input transistor sequentially coupled between an input terminal and a first node; and
the first node is coupled to a gate electrode of the first output transistor;
wherein the first processing subcircuit comprises a first switch transistor and a second switch transistor coupled between the first node and a first reference terminal; and
the first reference terminal is configured to receive a first reference signal;
wherein the first output transistor and a second output transistor of the output subcircuit are arranged in a first region;
input transistors, switch transistors, and control transistors of the respective scan unit are arranged in a second region;
capacitors of the respective scan unit are arranged in a third region; and
the second region, the first region, and the third region are sequentially arranged;
wherein the first input transistor, the second input transistor, the first switch transistor, and the second switch transistor are clustered in a central region;
the respective scan unit further comprises a first control transistor, a second control transistor, a third control transistor, and a fourth control transistor;
the first control transistor and the second control transistor are on a first side of the central region;
the third control transistor and the fourth control transistor are on a second side of the central region; and
the first side and the second side are two opposite sides with respect to the central region along an extension direction of one or more clock signal lines.

18. The display substrate of claim 17, wherein the second control transistor is on a side of the first control transistor closer to the one or more clock signal lines, and
the first control transistor is on a side of the second control transistor closer to the first output transistor and the second output transistor.

* * * * *